US012642033B2

(12) United States Patent　　　　　(10) Patent No.:　US 12,642,033 B2
Jae et al.　　　　　　　　　　　　　　　(45) Date of Patent:　　May 26, 2026

(54) APPARATUS FOR TREATING SUBSTRATE

(71) Applicant: SEMES CO., LTD., Cheonan-si (KR)

(72) Inventors: Jin Mo Jae, Cheonan-si (KR); Seung Hoon Oh, Cheonan-si (KR)

(73) Assignee: Semes Co., LTD., Cheonan-si (KR)

( * ) Notice: Subject to any disclaimer, the term of this patent is extended or adjusted under 35 U.S.C. 154(b) by 1001 days.

(21) Appl. No.: 17/826,936

(22) Filed: May 27, 2022

(65) Prior Publication Data

US 2022/0390172 A1　　Dec. 8, 2022

(30) Foreign Application Priority Data

May 28, 2021　(KR) ........................ 10-2021-0069039

(51) Int. Cl.
　　*C23C 16/44*　　　(2006.01)
　　*H01L 21/67*　　　(2006.01)
(52) U.S. Cl.
　　CPC .. *H01L 21/67017* (2013.01); *H01L 21/67034* (2013.01); *H01L 21/67103* (2013.01); *H01L 21/67248* (2013.01); *H01L 21/67253* (2013.01)
(58) Field of Classification Search
　　CPC .............. H01L 21/67; H01L 21/67034; A47B 2216/17; C23C 16/4412
　　USPC ..................................... 34/282, 201
　　See application file for complete search history.

(56) References Cited

U.S. PATENT DOCUMENTS

| | | | | |
|---|---|---|---|---|
| 4,929,462 A | * | 5/1990 | Moorman | ................ A23F 5/206 |
| | | | | 426/481 |
| 2013/0000140 A1 | * | 1/2013 | Jung | ................. H01L 21/67017 |
| | | | | 34/523 |
| 2019/0157074 A1 | * | 5/2019 | Delmas | ..................... B08B 3/02 |
| 2019/0355574 A1 | * | 11/2019 | Kanno | .............. H01L 21/67028 |
| 2020/0020550 A1 | * | 1/2020 | Goshi | ............... H01L 21/67034 |

FOREIGN PATENT DOCUMENTS

| | | |
|---|---|---|
| JP | H07174752 A | 7/1995 |
| JP | H10-165911 A | 6/1998 |
| JP | 2005072568 A | 3/2005 |
| JP | 2011124424 A | 6/2011 |
| JP | 2012-49446 A | 3/2012 |
| JP | 2018/0152479 A | 9/2018 |

(Continued)

OTHER PUBLICATIONS

Office Action dated Nov. 30, 2022, issued in corresponding Korean Patent Application No. 10-2021-0069039.

(Continued)

*Primary Examiner* — Deming Wan
(74) *Attorney, Agent, or Firm* — Harness, Dickey & Pierce, P.L.C

(57)　　　　　　　ABSTRACT

The inventive concept provides a substrate treating apparatus. The substrate treating apparatus includes a chamber providing an inner space; a fluid supply unit configured to supply a drying fluid to the inner space; and a fluid exhaust unit configured to exhaust the drying fluid from the inner space, and wherein the fluid exhaust unit includes an exhaust line connected to the chamber; a pressure adjusting member installed at the exhaust line and configured to maintain a pressure of the inner space at a set pressure; and a heating member installed at the pressure adjusting member or a back end of the pressure adjusting member.

19 Claims, 14 Drawing Sheets

(56)          References Cited

FOREIGN PATENT DOCUMENTS

JP          2020088016  A      6/2020
JP            6740098  B2      8/2020

OTHER PUBLICATIONS

1 Office Action for Korean Application No. 10-2021-0069039 dated
Feb. 23, 2024.
Japanese Office Action, dated Jul. 4, 2023, issued in corresponding
Japanese Patent Application No. 2022-086921.

* cited by examiner

APPARATUS FOR TREATING SUBSTRATE

CROSS-REFERENCE TO RELATED APPLICATIONS

A claim for priority under 35 U.S.C. § 119 is made to Korean Patent Application No. 10-2021-0069039 filed on May 28, 2021, in the Korean Intellectual Property Office, the entire contents of which are hereby incorporated by reference.

BACKGROUND

Embodiments of the inventive concept described herein relate to a substrate treating apparatus.

In order to manufacture a semiconductor device, a desired pattern is formed on a substrate such as a wafer through various processes such as a photolithography process, an etching process, an ashing process, an ion implantation process, and a thin film deposition process, etc. Various treating liquids and treating gases are used in each process, and particles and process by-products are generated during a process. To remove such particles and process by-products from the substrate, a cleaning process is performed before and after each process.

Generally, the cleaning process liquid treats the substrate with a chemical or a rinsing liquid. Also, a drying treatment is performed to remove a chemical or a rinsing liquid remaining on the substrate. In an embodiment of the drying treatment, there is a rotary drying process of rotating the substrate at a high speed to remove the rinsing liquid remaining on the substrate. However, such a rotary drying method has a risk in that a pattern formed on the substrate may collapse.

Recently, a supercritical drying process of supplying an organic solvent such as an isopropyl alcohol (IPA) onto the substrate to replace the rinsing liquid remaining on the substrate with the organic solvent having a low surface tension, and then supplying a drying gas (e.g., a carbon dioxide) in a supercritical state on the substrate to remove the organic solvent remaining on the substrate. In the supercritical drying process, the drying gas is supplied to a process chamber with an inside sealed, and the drying gas is heated and pressurized. Both a temperature and a pressure of the drying gas rises above a threshold point, and the drying gas phase changes to a supercritical state.

The drying gas in the supercritical state has high dissolvability and permeability. That is, when the drying gas in the supercritical state is supplied to the substrate, the drying gas easily permeates into the pattern on the substrate, and the organic solvent remaining on the substrate is also easily dissolved in the drying gas. Accordingly, it is possible to easily remove the organic solvent remaining between the pattern formed on the substrate and the pattern.

However, the drying gas in the supercritical state within the process chamber has little flow. Accordingly, the drying gas in the supercritical state may not be appropriately transferred to the substrate. In this case, the organic solvent remaining on the substrate may not be appropriately removed, or the drying gas in the supercritical state in which the organic solvent is dissolved may not be appropriately exhausted to the outside of the process chamber.

In order to solve this problem, a method for changing a pressure within the process chamber is generally used as shown in FIG. 1. Referring to FIG. 1, in a pressurization step S100, the pressure within the process chamber is increased to a first pressure CP1, and in a process step S200, the pressure in the process chamber is repeatedly changed between the first pressure CP1 and a second pressure CP2, which is lower than the first pressure CP1. Thereafter, in the depressurization step S300, the pressure in the process chamber is changed to an atmospheric pressure. By repeatedly changing the pressure within the process chamber in the process step S200, a flow of the drying gas in the supercritical state within the process chamber is generated, and the drying gas in the supercritical state may be transferred to the substrate.

A method of repeatedly changing the pressure within the process chamber between the first pressure CP1 and the second pressure CP2 is generally performed by repeatedly changing on on/off of a valve installed at a supply line for supplying the drying gas into the process chamber and a valve installed at an exhaust line for exhausting an inner space of the process chamber. When the valves are repeatedly turned on/off as described above, particles may be generated in the valves, and the particles may be transferred to the process chamber through the supply line or the exhaust line. In addition, the method of repeatedly changing the pressure within the process chamber between the first pressure CP1 and the second pressure CP2 increases a time required to perform the process step S200. This is because there is a physical limit to reducing a time required for a pressurization and a time required for a depressurization in the process step S200. In addition, when the respective valves are quickly turned on/off in order to reduce the time required for the pressurization and the time required for the depressurization, the pressurization and the depressurization are not appropriately performed, and rather, the flow of the drying gas in the supercritical state may be disturbed.

SUMMARY

Embodiments of the inventive concept provide a substrate treating apparatus for efficiently treating a substrate.

Embodiments of the inventive concept provide a substrate treating apparatus for increasing a drying treatment efficiency of a substrate.

Embodiments of the inventive concept provide a substrate treating apparatus for reducing a time required to perform a drying process for drying a substrate.

Embodiments of the inventive concept provide a substrate treating apparatus for minimizing a generation of impurities such as particles while performing a drying process for drying a substrate.

Embodiments of the inventive concept provide a substrate treating apparatus for compensating for a temperature decrease that may occur when a drying fluid flows through a pressure adjusting member.

Embodiments of the inventive concept provide a substrate treating apparatus for minimizing a problem of a treating liquid attaching to an exhaust line.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a chamber providing an inner space; a fluid supply unit configured to supply a drying fluid to the inner space; and a fluid exhaust unit configured to exhaust the drying fluid from the inner space, and wherein the fluid exhaust unit includes: an exhaust line connected to the chamber; a pressure adjusting member installed at the exhaust line and configured to maintain a pressure of the inner space at a set pressure; and a heating member installed at the pressure adjusting member or a back end of the pressure adjusting member.

In an embodiment, the substrate treating apparatus further includes a controller, and wherein the controller controls the fluid supply unit to perform a pressurization step for pressurizing a pressure of the inner space to the set pressure by supplying the drying fluid to the inner space, and controls the fluid supply unit and the fluid exhaust unit to perform a flow step for which the fluid exhaust unit generates a flow of the drying fluid at the inner space by exhausting the drying fluid from the inner space while the drying fluid is supplied to the inner space.

In an embodiment, the controller controls the fluid supply unit and the fluid exhaust unit so the drying fluid supplied to the inner space at the flow step has a difference of 0 between a supply rate per unit time and an exhaust flow rate per unit time of the drying fluid exhausted from the inner space, or a difference within a threshold value.

In an embodiment, the controller controls the fluid supply unit and the fluid exhaust unit so the pressure of the inner space is maintained at the set pressure at the flow step.

In an embodiment, the set pressure is the same as a critical pressure for maintaining a supercritical state of the drying fluid at the inner space, or a pressure higher than the critical pressure.

In an embodiment, the fluid exhaust unit further includes an exhaust valve installed at a front end of the pressure adjusting member, and wherein the controller controls the fluid exhaust unit to open the exhaust valve while the flow step is performed.

In an embodiment, the heating member adjusts a temperature to a temperature which can compensate for a temperature reduction of the drying fluid generated while going through the pressure adjusting member.

In an embodiment, the heating member includes: a heating element configured to generate a heat; and a temperature sensor configured to measure a temperature of the drying fluid flowing through the exhaust line or a temperature of the heating element, and wherein the heating element generates the heat based on a measured result of the temperature sensor.

In an embodiment, the heating element turns on to generate the heat when the measured result of the temperature sensor is lower than a bottom limit of a preset temperature range, and turns off to stop a generation of the heat when the measured result of the temperature sensor is higher than a top limit of the preset temperature range.

In an embodiment, the fluid supply unit includes: a fluid supply source for storing and supplying the drying fluid; a supply line for fluid communicating the fluid supply source and the inner space; and a flow rate adjusting valve installed at the supply line; and a heater installed at the flow rate adjusting valve or at a back end of the flow rate adjusting valve.

The inventive concept provides a substrate treating apparatus for removing a treating liquid remaining on a substrate using a drying fluid in a supercritical state. The substrate treating apparatus includes a chamber providing an inner space; a fluid supply unit configured to supply a drying fluid to the inner space; a fluid exhaust unit configured to exhaust the drying fluid from the inner space, and a controller configured to control the fluid supply unit and the fluid exhaust unit, and wherein the controller controls the fluid supply unit to perform a pressurization step for pressurizing a pressure of the inner space to a set pressure by supplying the drying fluid to the inner space, and controls the fluid supply unit and the fluid exhaust unit to perform a flow step of both supplying the drying fluid to the inner space and exhausting the drying fluid from the inner space, while maintaining the pressure of the inner space to the set pressure, and wherein the fluid exhaust unit includes: an exhaust line connected to the chamber; a pressure adjusting member installed at the exhaust line and configured to maintain the pressure of the inner space to the set pressure; and a heating member installed at the pressure adjusting member or at a back end of the pressure adjusting member.

In an embodiment, the fluid exhaust unit further includes an exhaust valve installed at a front end of the pressure adjusting member, and wherein the controller controls the fluid exhaust unit to open the exhaust valve while the flow step is being performed.

In an embodiment, the heating member adjusts a temperature to a temperature which can compensate for a temperature reduction of the drying fluid generated while going through the pressure adjustment member.

In an embodiment, the heating member includes: a heating element configured to generate a heat; and a temperature sensor configured to measure a temperature of the drying fluid flowing through the exhaust line or a temperature of the heating element, and wherein the heating element generates the heat based on a measured result of the temperature sensor.

In an embodiment, the heating element turns on to generate the heat when the measured result of the temperature sensor is lower than a bottom limit of a preset temperature range, and turns off to stop a generation of the heat when the measured result of the temperature sensor is higher than a top limit of the preset temperature range.

In an embodiment, the fluid supply unit includes: a fluid supply source for storing and supplying the drying fluid; a supply line for fluid communicating the fluid supply source and the inner space; and a flow rate adjusting valve installed at the supply line; and a heater installed at the flow rate adjusting valve or at a back end of the flow rate adjusting valve.

The inventive concept provides a substrate treating apparatus. The substrate treating apparatus includes a chamber providing an inner space; a transfer robot configured to transfer a substrate having a remaining treating liquid to an inner space; a fluid supply unit configured to supply a drying fluid including a carbon dioxide to the inner space; a fluid exhaust unit configured to exhaust the drying fluid from the inner space, and a controller configured to control the fluid supply unit and the fluid exhaust unit, and wherein the fluid exhaust unit includes: an exhaust line connected to the chamber; a pressure adjusting member installed at the exhaust line and configured to adjust a pressure of the inner space at a set pressure; and a heating member configured to compensate for a temperature reduction of the drying fluid while going through the pressure adjusting member.

In an embodiment, the substrate treating apparatus further includes a controller, and wherein the controller controls the fluid supply unit to perform a pressurization step for pressurizing a pressure of the inner space to the set pressure by supplying the drying fluid to the inner space, and controls the fluid supply unit and the fluid exhaust unit to perform a flow step for which the fluid exhaust unit generates a flow of the drying fluid at the inner space by exhausting the drying fluid from the inner space while the drying fluid is supplied to the inner space.

In an embodiment, the heating member is a jacket heater installed to surround the pressure adjusting member.

5

6

In an embodiment, the heating member is a block heater installed at the exhaust line and installed at a further back end than the pressure adjusting member.

According to an embodiment of the inventive concept, a substrate may be treated efficiently.

According to an embodiment of the inventive concept, a drying treatment efficiency of a substrate may be increased.

According to an embodiment of the inventive concept, a drying treatment efficiency of a substrate may be increased.

According to an embodiment of the inventive concept, a time required to perform a drying process for drying a substrate may be reduced.

According to an embodiment of the inventive concept, a generation of impurities such as particles while performing a drying process for drying a substrate may be minimized.

According to an embodiment of the inventive concept, a temperature decrease that may occur when a drying fluid flows through a pressure adjusting member may be compensated.

According to an embodiment of the inventive concept, a problem of a treating liquid attaching to an exhaust line may be minimized.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 11 illustrates the drying chamber performing a second vent step of FIG. 5.

DETAILED DESCRIPTION

Figure 1:
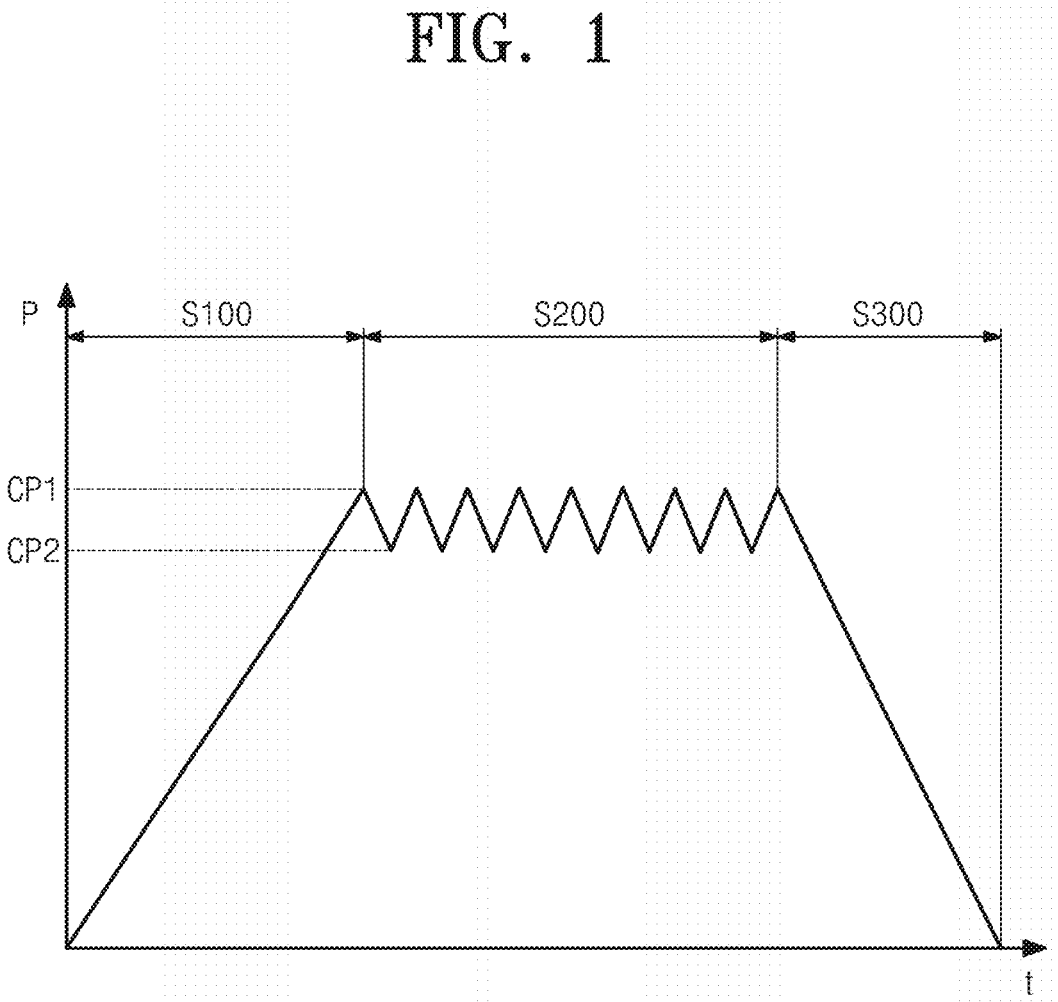
FIG. 1 illustrates a pressure change within a process chamber for performing a conventional supercritical drying process.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising", "includes", and/or "including" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "example" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Other terms such as "between", "adjacent", "near" or the like should be interpreted in the same way.

Unless otherwise defined, all terms used herein, including technical or scientific terms, have the same meaning as those generally understood by those skilled in the art to which the inventive concept belongs. Terms such as those defined in commonly used dictionaries should be interpreted as consistent with the context of the relevant technology and not as ideal or excessively formal unless clearly defined in this application.

Figure 2:
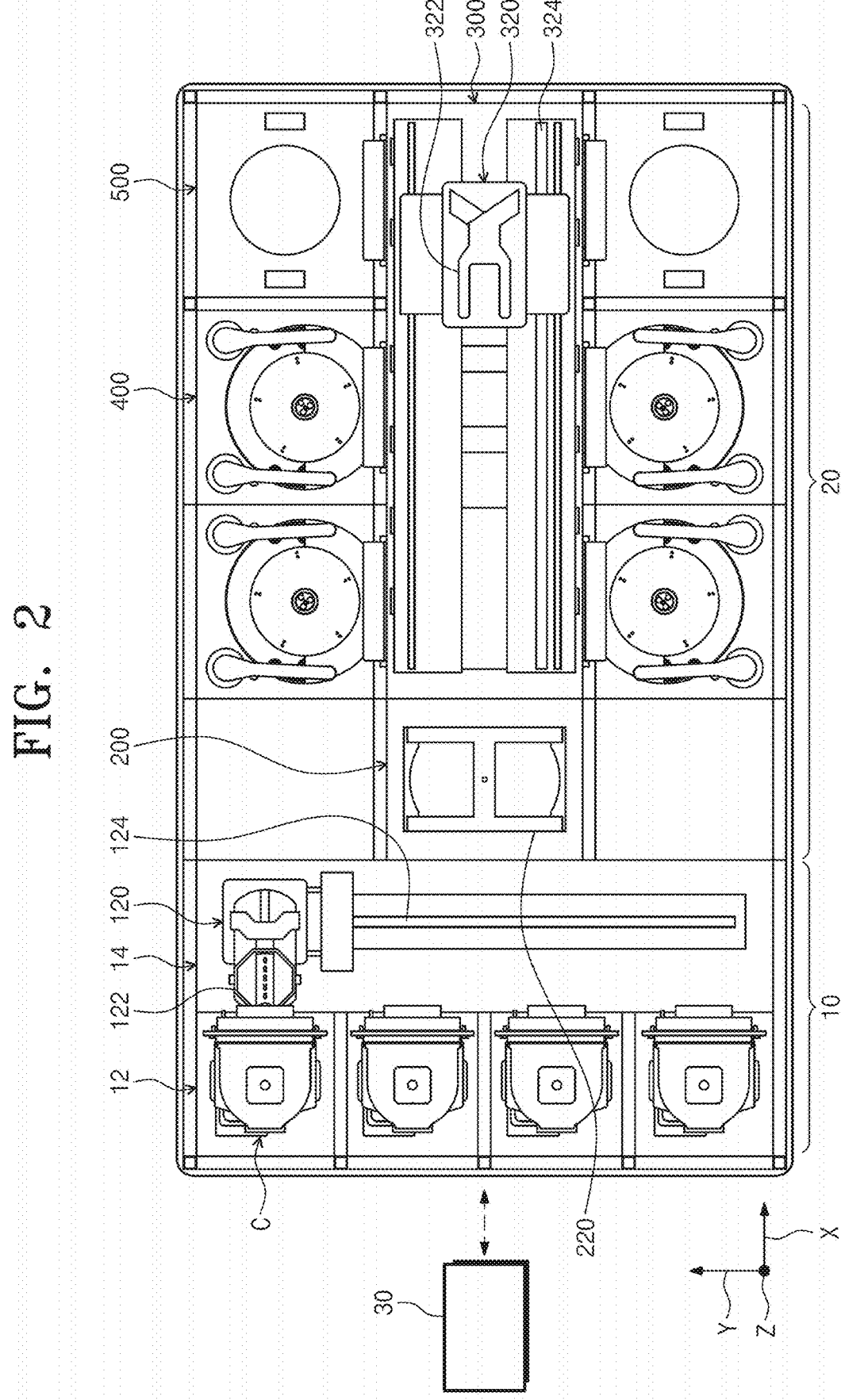
FIG. 2 is a plan view schematically illustrating a substrate treating apparatus according to an embodiment of the inventive concept.

FIG. 2 is a plan view schematically illustrating a substrate treating apparatus according to an embodiment of the inventive concept.

Referring to FIG. 2, the substrate treating apparatus includes an index module 10, a treating module 20, and a controller 30. The index module 10 and the treating module 20 are disposed in a direction. Hereinafter, the direction in which the index module 10 and the treating module 20 are disposed will be referred to as a first direction X, a direction perpendicular to the first direction X will be referred to as a second direction Y, and a direction perpendicular to both the first direction X and the second direction Y will be referred to as a third direction Z.

The index module 10 transfers a substrate W from a container C in which the substrate W is stored to the treating module 20, and stores a substrate W to which a treating has been completed at the treating module 20 in the container C. A lengthwise direction of the index module 10 is provided in the second direction Y. The index module 10 has a load port 12 and an index frame 14. The index frame 14 is located between the load port 12 and the treating module 20. The container C in which the substrates W are stored is placed on the load port 12. A plurality of load ports 12 may be provided, and the plurality of load ports 12 may be disposed along the second direction Y.

For the container C, a sealed container such as a front open unified pod FOUP may be used. The container C may be placed on the load port 12 by a transfer means (not illustrated) such as an overhead transfer, an overhead conveyor, or an automatic guided vehicle or by an operator.

The index frame 14 is provided with an index robot 120. In the index frame 14, a guide rail 124 with its lengthwise direction in the second direction Y may be provided, and the index robot 120 may be provided to be movable along the guide rail 124. The index robot 120 may include a hand 122 on which the substrate W is placed, and the hand 122 may be forwardly and backwardly movable, rotatable around the third direction Z, and movable along the third direction Z. A plurality of hands 122 are provided to be spaced apart in an up/down direction, and the hands 122 may be forwardly and backwardly movable independently of each other.

The controller 30 may control the substrate treating apparatus. The controller may include a process controller e.g., a microprocessor (computer) that executes a control of the substrate treating apparatus, a user interface e.g., a keyboard in which an operator performs a command input operation or the like in order to manage the substrate treating apparatus, a display for visualizing and displaying an operation situation of the substrate treating apparatus, and the like, and a storage unit storing a control program for executing the process performed in the substrate treating apparatus under the control of the process controller, a various data and a program(i.e., treatment recipe) for executing various process in each component according to treating conditions. Further, the user interface and the storage unit may be connected to the process controller. The treatment recipe may be stored in a storage medium in the storage unit, and the storage medium may be a hard disk, and may also be a portable disk, such as a CD-ROM or a DVD, or a semiconductor memory, such as a flash memory.

The controller 30 may control the substrate treating apparatus to perform the substrate treating method described below. For example, the controller 30 may control the fluid supply unit 530 and the fluid exhaust unit 550 to perform the substrate treating method.

The treating module 20 includes a buffer unit 200, a transfer chamber 300, a liquid treating chamber 400, and a drying chamber 500. The buffer unit 200 provides a space in which the substrate W carried into the treating module 20 and the substrate W carried out from the treating module 20 temporarily stay. The liquid treating chamber 400 supplies a liquid onto the substrate W to perform a liquid treatment process of liquid treating the substrate W. The drying chamber 500 performs a drying process of removing a liquid remaining on the substrate W. The transfer chamber 300 transfers the substrate W between the buffer unit 200, the liquid treating chamber 400, and the drying chamber 500.

A lengthwise direction of the transfer chamber 300 may be provided in the first direction X. The buffer unit 200 may be disposed between the index module 10 and the transfer chamber 300. The liquid treating chamber 400 and the drying chamber 500 may be disposed on a side of the transfer chamber 300. The liquid treating chamber 400 and the transfer chamber 300 may be disposed along the second direction Y. The drying chamber 500 and the transfer chamber 300 may be disposed along the second direction Y. The buffer unit 200 may be located at an end of the transfer chamber 300.

According to an embodiment, the liquid treating chambers 400 may be disposed on both sides of the transfer chamber 300, the drying chambers 500 may be disposed on both sides of the transfer chamber 300, and the liquid treating chambers 400 may be disposed closer to the buffer unit 200 than the drying chambers 500. In some embodiments, at one and/or both sides of the transfer chamber 300, the liquid treating chambers 400 may be provided in an arrangement of AXB (A and B are natural numbers greater than 1 or 1) along the first direction X and the third direction Z. In some embodiments, at one and/or both sides of the transfer chamber 300, the drying chambers 500 may be provided in an arrangement of CXD (C and D are natural numbers greater than 1 or 1) along the first direction X and the third direction Z. In some embodiments, only liquid treating chambers 400 may be provided at one side of the transfer chamber 300, and only dry chambers 500 may be provided at the other side of the transfer chamber 300.

The transfer chamber 300 has a transfer robot 320. In the transfer chamber 300, a guide rail 324 with its lengthwise direction provided in the first direction X may be provided, and the transfer robot 320 may be provided to be movable on the guide rail 324. The transfer robot 320 may include a hand 322 on which the substrate W is placed, and the hand 322 may be provided to be forwardly and backwardly movable, rotatable around the third direction Z as an axis, and movable along the third direction Z. A plurality of hands 322 are provided to be spaced apart in the up/down direction, and the hands 322 may be forwardly and backwardly movable independently from each other.

The buffer unit 200 includes a plurality of buffers 220 on which the substrate W is placed. The buffers 220 may be disposed to be spaced apart from each other in the third direction Z. A front face and a rear face of the buffer unit 200 are opened. The front face is a surface facing the index module 10, and the rear face is a surface facing the transfer chamber 300. The index robot 120 may access the buffer unit 200 through the front face, and the transfer robot 320 may access the buffer unit 200 through the rear face.

Figure 3:
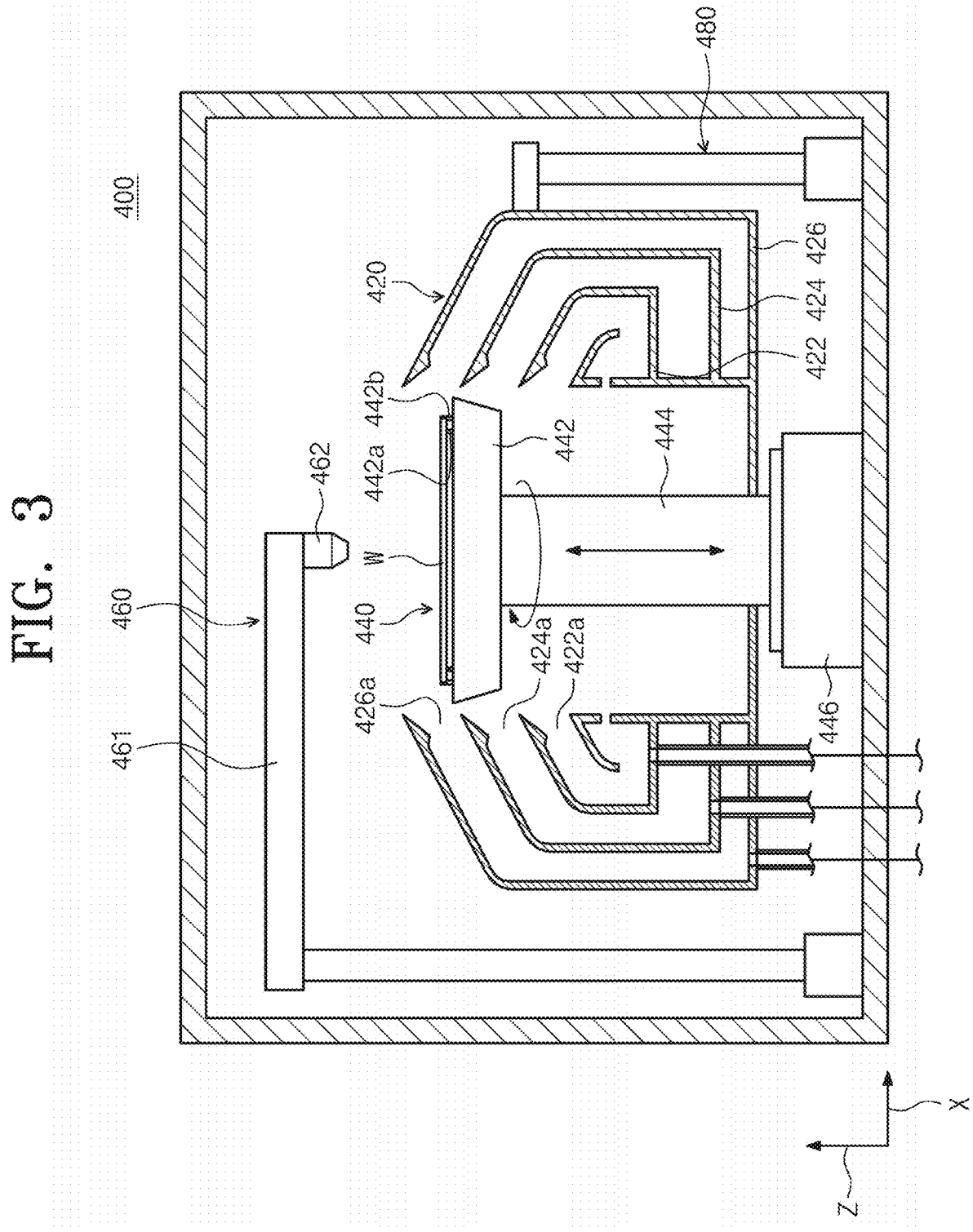
FIG. 3 schematically illustrates an embodiment of a liquid treating chamber of FIG. 1.

FIG. 3 is a view schematically illustrating an embodiment of the liquid treating chamber of FIG. 1. Referring to FIG. 3, the liquid treating chamber 400 includes a housing 410, a cup 420, a support unit 440, a liquid supply unit 460, and a lifting/lowering unit 480.

The housing 410 may have an inner space in which the substrate W is treated. The housing 410 may have a generally hexahedral shape. For example, the housing 410 may have a rectangular parallelepiped shape. In addition, an opening (not shown) through which the substrate W is taken in or taken out may be formed in the housing 410. In addition, a door (not shown) for selectively opening and closing the opening may be installed at the housing 410.

The cup 420 may have a container shape with an open top. The cup 420 may have a treating space, and the substrate W may be liquid-treated in the treating space. The support unit 440 supports the substrate W in the treating space. The liquid supply unit 460 supplies the treating liquid onto the substrate W supported by the support unit 440. The treating liquid may be provided in a plurality of types and may be sequentially supplied onto the substrate W. The lifting/lowering unit 480 adjusts a relative height between the cup 420 and the support unit 440.

In an embodiment, the cup 420 has a plurality of recollecting containers 422, 424, and 426. Each of the recollecting containers 422, 424, and 426 has a recollecting space for recollecting the liquid used for substrate treatment. Each of the recollecting containers 422, 424, and 426 is provided in a ring shape surrounding the support unit 440. During a liquid treatment process, the treating liquid scattered by a rotation of the substrate W is introduced into the recollecting space through the inlets 422a, 424a, and 426a of each respective recollecting container 422, 424, and 426. According to an embodiment, the cup 420 has a first recollecting container 422, a second recollecting container 424, and a third recollecting container 426. The first recollecting container 422 is disposed to surround the support unit 440, the second recollecting container 424 is disposed to surround the first recollecting container 422, and the third recollecting container 426 is disposed to surround the second recollecting container 424. The second inlet 424a introducing the liquid into the second recollecting container 424 may be located above the first inlet 422a introducing the liquid into the first recollecting container 422, and the third inlet 426a introducing the liquid into the third recollecting container 424a may be located above the second inlet 424a.

The support unit 440 has a support plate 442 and a drive shaft 444. A top surface of the support plate 442 is provided in a substantially circular shape and may have a diameter larger than that of the substrate W. A support pin 442a is provided at a central part of the support plate 442 to support a bottom surface of the substrate W, and the support pin 442a is provided to protrude from the support plate 442 such that the substrate W is spaced apart from the support plate 442 by a predetermined distance. A chuck pin 442b is provided at an edge of the support plate 442. The chuck pin 442b is provided to upwardly protrude from the support plate 442, and supports a side of the substrate W so that the substrate W is stably held by the support unit 440 when the substrate W is rotated. The drive shaft 444 is driven by the driver 446, is connected to the center of the bottom surface of the substrate W, and rotates the support plate 442 based on its central axis.

According to an embodiment, the liquid supply unit 460 may include a nozzle 462. The nozzle 462 may supply the treating liquid to the substrate W. The treating liquid may be a chemical, a rinsing liquid, or an organic solvent. The chemical may be a chemical with strong acid properties or strong base properties. In addition, the rinsing liquid may be a deionized water. In addition, the organic solvent may be an isopropyl alcohol (IPA).

In addition, the liquid supply unit 460 may include a plurality of nozzles 462, and each nozzle 462 may supply a different type of treating liquid. For example, one of the nozzles 462 may supply a chemical, another one of the nozzles 462 may supply the rinsing liquid, and still another one of the nozzles 462 may supply an organic solvent. In addition, the controller 30 may control the liquid supply unit 460 to supply the organic solvent from the still another one of the nozzles 462 to the substrate W after supplying the rinsing liquid to the substrate W from the another one of the nozzles 462. Accordingly, the rinsing liquid supplied onto the substrate W may be substituted with an organic solvent having a small surface tension.

The lifting/lowering unit 480 moves the cup 420 in the up/down direction. A relative height between the cup 420 and the substrate W is changed by the up/down vertical movement of the cup 420. As a result, the recollecting containers 422, 424, 426 for recollecting the treating liquid are changed in accordance with a type of liquid supplied to the substrate W, so that the liquids can be recollected separately. Unlike the above description, the cup 420 is fixedly installed, and the lifting/lowering unit 480 may move the support unit 440 in the up/down direction.

Figure 4:
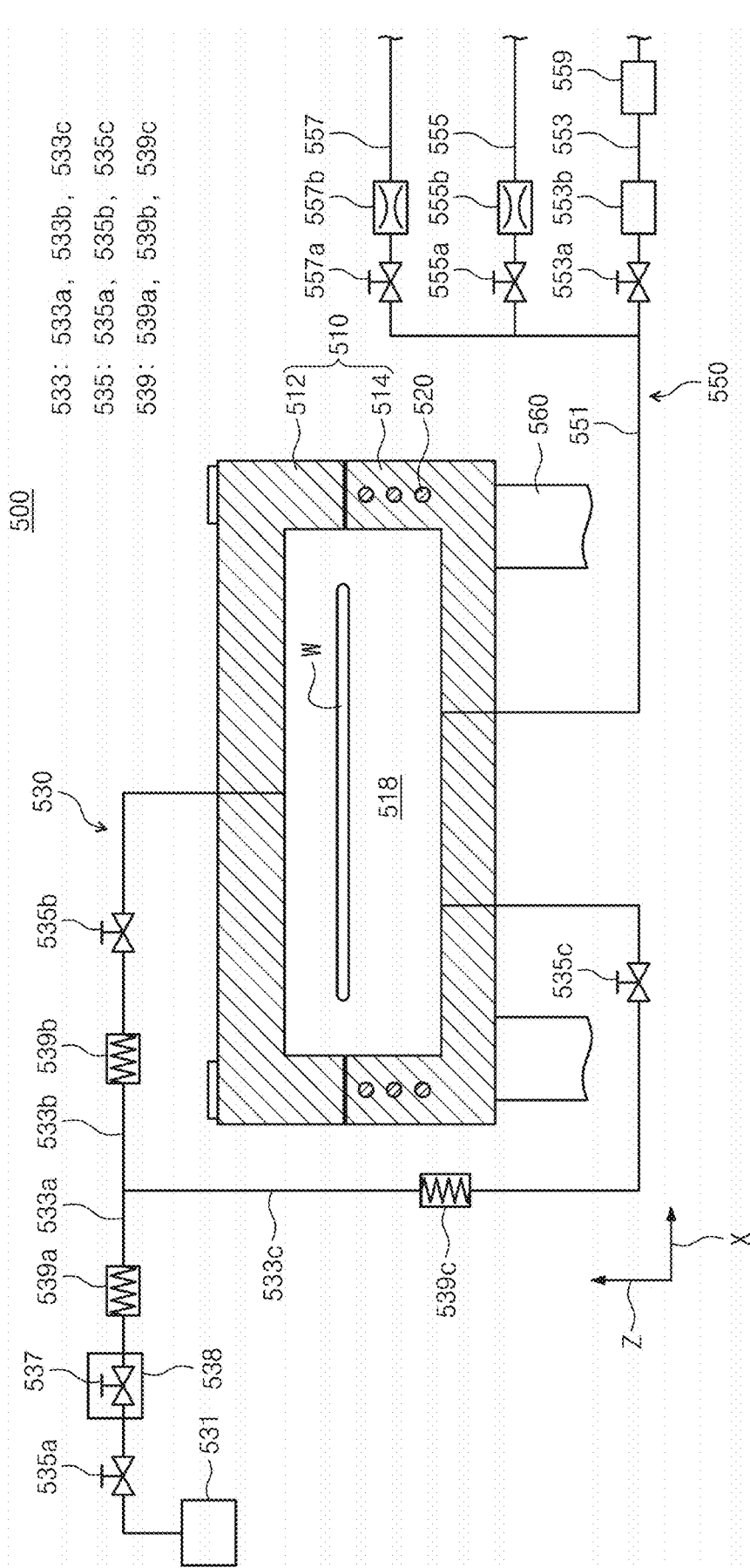
FIG. 4 schematically illustrates an embodiment of a drying chamber of FIG. 1.

FIG. 4 is a view schematically illustrating an embodiment of the drying chamber of FIG. 1. Referring to FIG. 4, the drying chamber 500 according to an embodiment of the inventive concept may remove the treating liquid remaining on the substrate W by using a drying fluid G in a supercritical state. For example, the drying chamber 500 may remove an organic solvent remaining on the substrate W from the substrate W using the carbon dioxide $CO_2$ in a supercritical state.

The drying chamber 500 may include a body 510, a temperature adjusting member 520, a fluid supply unit 530, a fluid exhaust unit 550, and a lifting/lowering member 560. The body 510 may have an inner space 518 for treating the substrate W. The body 510 may provide an inner space 518 for treating the substrate W. The body 510 may provide an inner space 518 in which the substrate W is dry-treated by the drying fluid G in a supercritical state. The body 510 may also be referred to as a chamber or a vessel.

The body 510 may include a top body 512 and a bottom body 514. The top body 512 and the bottom body 514 may be combined with each other to form the inner space 518. The substrate W may be supported at the inner space 118. For example, the substrate W may be supported by a support member (not shown) at the inner space 518. The support member may be configured to support a bottom surface of an edge region of the substrate W. Any one of the top body 512 or the bottom body 514 may be coupled to the lifting/lowering member 560 to be moved in the up/down direction. For example, the bottom body 514 may be coupled to the lifting/lowering member 560 to be moved in the up/down direction by the lifting/lowering member 560. Accordingly, the inner space 518 of the body 510 may be selectively sealed. In the above-described example, the bottom body 514 is coupled to the lifting/lowering member 560 to move in the up/down direction, but this invention is not limited to it. For example, the top body 512 may be coupled to the lifting/lowering member 560 to move in the up/down direction.

The temperature adjusting member 520 may heat the drying fluid G supplied to the inner space 518. The temperature adjusting member 520 may increase a temperature of the inner space 518 of the body 510. As the temperature adjusting member 520 increases the temperature of the inner space 518, the drying fluid G supplied to the inner space 518 may be changed into a supercritical state.

In addition, the temperature adjusting member 520 may increase the temperature of the inner space 518 of the body 510 so the drying fluid G in a supercritical state supplied to the inner space 518 is maintained in a supercritical state.

In addition, the temperature adjusting member 520 may be buried in the body 510. For example, the temperature adjusting member 520 may be buried in any one of the top body 512 or the bottom body 514. For example, the temperature adjusting member 520 may be provided in the bottom body 514. However, the inventive concept is not limited thereto, and the temperature adjusting member 520 may be provided at various positions capable of raising the temperature of the inner space 518. In addition, the temperature adjusting member 520 may be a heater. However, the inventive concept is not limited thereto, and the temperature adjusting member 520 may be variously modified into a known device capable of raising the temperature of the inner space 518.

The fluid supply unit 530 may supply the drying fluid G to the inner space 518 of the body 510. The drying fluid G supplied by the fluid supply unit 530 may include a carbon dioxide $CO_2$. The fluid supply unit 530 may include a fluid supply source 531, a supply line 533, a supply valve 535, flow rate adjusting valve 357, a valve heater 358, and a line heater 359.

The fluid supply source 531 may store and/or supply the drying fluid G supplied to the inner space 518 of the body 510. The drying fluid G stored and/or supplied by the fluid supply source 531 may be supplied to the inner space 518 through the supply line 533.

The supply line 533 may fluidly communicate the fluid supply source 531 and the inner space 518. The supply line 533 may include a main supply line 533a, a first supply line 533b, and a second supply line 533c. An end of the main supply line 533a may be connected to the fluid supply source 531. The other end of the main supply line 533a may branch into the first supply line 533b and the second supply line 533c.

In addition, the first supply line 533b may be a top supply line for supplying the drying gas from a top portion of the inner space 518 of the body 510. For example, the first supply line 533b may supply the drying gas to the inner space 518 of the body 510 in a direction from a top to a bottom. For example, the first supply line 533b may be connected to the top body 512. In addition, the second supply line 533c may be a lower supply line for supplying the drying gas from a bottom portion of the inner space 518 of the body 510. For example, the second supply line 533c may supply the drying gas to the inner space 518 of the body 510 in a direction from the bottom to the top. For example, the second supply line 533c may be connected to the bottom body 514.

The supply valve 535 may include a main supply valve 535a, a first supply valve 535b, and a second supply valve 535c.

A main supply valve 535a, which is an on/off valve (auto valve), may be installed at the main supply line 533a. The first supply valve 535b, which is an on/off valve (auto valve), may be installed at the first supply line 533b. The second supply valve 535c, which is an on/off valve (auto valve), may be installed at the second supply line 533c.

In addition, a flow rate control valve 537, which is a metering valve, may be installed at the main supply line 533a. The flow rate control valve 537 may be installed downstream from the main supply valve 535a. The drying fluid G may be adiabatically compressed while passing through the flow control valve 537. Accordingly, the drying fluid G may be adiabatically expanded at a back end of the flow control valve 537. For example, the drying fluid G may be adiabatically expanded at the main supply line 533a downstream from the flow control valve 537. That is, a temperature of the drying fluid G may decrease at the back end of the flow control valve 537. Accordingly, a condensation or a freezing may occur at the main supply line 533a. In order to solve this problem, a valve heater 538 may be installed at the flow control valve 537. The valve heater 538 may be a jacket heater installed to surround the flow rate control valve 537.

The heater 539 may include a main heater 539a, a first heater 539b, and a second heater 539c. The main heater 539a, which is a block heater, may be installed at the main supply line 533a. The main heater 539 may be installed downstream of the flow control valve 537 (back end of the flow control valve 537). The first heater 539b, which is a block heater, may be installed at the first supply line 533b. The first heater 539b may be installed downstream from the point where the main supply line 533a branches and upstream from the first supply valve 535b. The second heater 539c, which is a block heater, may be installed at the second supply line 533c. The second heater 539c may be installed downstream from the point where the main supply line 533a branches and upstream from the second supply valve 535c.

The fluid exhaust unit 550 may exhaust the drying fluid G from the inner space 518 of the body 510. The fluid exhaust unit 550 may include exhaust lines such as a main exhaust line 551, a flow line 553, a slow vent line 555, and a quick vent line 557. In addition, the fluid exhaust unit 550 may include an exhaust valve such as a first exhaust valve 553a, a second exhaust valve 555a, and a third exhaust valve 557a installed at the exhaust line. In addition, the fluid exhaust unit 550 may include a pressure adjusting member 553b installed at the exhaust line, and an orifice such as a slow vent line orifice 555b and a quick vent line orifice 557b.

The main exhaust line 551 may be connected to the body 510. The main exhaust line 551 may exhaust the drying fluid G supplied to the inner space 518 of the body 510 to the outside of the body 510. For example, an end of the main exhaust line 551 may be connected to the body 510. An end of the main exhaust line 551 may be connected to one of the top body 512 or the bottom body 514. For example, an end of the main exhaust line 551 may be connected to the bottom body 514. In addition, an other end of the main exhaust line 551 may be branched. For example, the other end of the main exhaust line 551 may be branched. A line on which the main exhaust line 551 is branched may include a flow line 553, a slow vent line 555, and a quick vent line 557.

The flow line 553 may branch from the other end of the main exhaust line 551. A first exhaust valve 553a, a pressure adjusting member 553b, and a heating member 559 may be installed at the main exhaust line 551. The first exhaust valve 553a may be installed upstream of the pressure adjusting member 553b. The first exhaust valve 553a may be an on/off valve (auto valve). The first exhaust valve 553a may selectively allow the drying fluid G to flow in the main exhaust line 551. In addition, the flow line 553 may be used in the flow step S33 to be described later.

In addition, the pressure adjusting member 553b may keep a pressure of the inner space 518 of the body 510 constant at a set pressure. In addition, the pressure adjusting member 553b may adjust an exhaust flow rate per unit time of the drying fluid G exhausted through the flow line 553 so as to maintain the pressure of the inner space 518 of the body 510 at the set pressure. For example, the pressure adjusting member 553b may be a back pressure regulator (BPR). For example, assuming that the set pressure of the body 510 to the inner space 518 is 150 bar, the pressure adjusting member 553*b* may prevent the drying fluid G from being exhausted through the flow line 553 until the set pressure of the body 510 reaches 150 bar. In addition, when the pressure of the inner space 518 of the body 510 reaches a pressure higher than the set pressure, for example, 170 bar, the drying fluid G may be exhausted through the flow line 553 so that the pressure of the inner space 518 of the body 510 may be lowered to 150 bar.

In addition, the heating member 559 may be installed at a back end of the pressure adjusting member 553*b*. The heating member 559 may be a block heater. The heating member 559 may be installed at the flow line 553. The heating member 559 can contain a heating element generating a heat, and a temperature sensor for measuring a temperature of the drying fluid flowing in the flow line 553 or a temperature of the heating element. As described later, the heating element can be adjusted to a temperature capable of compensating for a temperature degradation caused by the drying fluid G passing through the pressure adjusting member 553*b*. For example, the heating element of the heating member 559 may be adjusted to a temperature of about 200° C.

The heating element may generate a heat based on a measurement result of the temperature sensor. For example, when the measurement result of the temperature sensor is lower than a lower limit of a preset temperature range, the heating element may be turned on to generate a heat. This is to compensate for a decrease in a temperature occurring at the back end of the pressure adjusting member 553*b* as described later. In addition, when the measurement result of the temperature sensor is higher than an upper limit of the preset temperature range, it may be turned off to stop a generation of heat. This is to prevent an overheating of the heating member 559.

The slow vent line 555 may branch from the other end of the main exhaust line 551. The slow vent line 555 may lower a pressure of the inner space 518 of the body 510. The slow vent line 555 may be used at the first vent step S34 to be described later. A second exhaust valve 555*a* and a slow vent line orifice 555*b* may be installed at the slow vent line 555. The second exhaust valve 555*a* may be installed upstream of the slow vent line orifice 555*b*. The second exhaust valve 555*a* may be an on/off valve (auto valve). In addition, a diameter of a flow path of the slow vent line orifice 555*b* may be smaller than a diameter of a flow path of the quick vent line orifice 557*b* to be described later.

The quick vent line 557 may branch from the other end of the main exhaust line 551. The quick vent line 557 may lower the pressure of the inner space 518 of the body 510. The quick vent line 557 may be used in a second vent step S35 to be described later. A third exhaust valve 557*a* and a quick vent line orifice 557*b* may be installed at the quick vent line 557. The third exhaust valve 557*a* may be installed upstream of the quick vent line orifice 555*b*. The third exhaust valve 557*a* may be an on/off valve (auto valve). In addition, the diameter of the flow path of the quick vent line orifice 557*b* may be larger than the diameter of the flow path of the slow vent line orifice 555*b* to be described later.

Hereinafter, a method of treating the substrate according to an embodiment of the inventive concept will be described. The substrate treating method described below may be performed by a substrate treating apparatus. As described above, the controller 30 may control the substrate treating apparatus so that the substrate treating apparatus may perform the substrate treating method described below.

Figure 5:
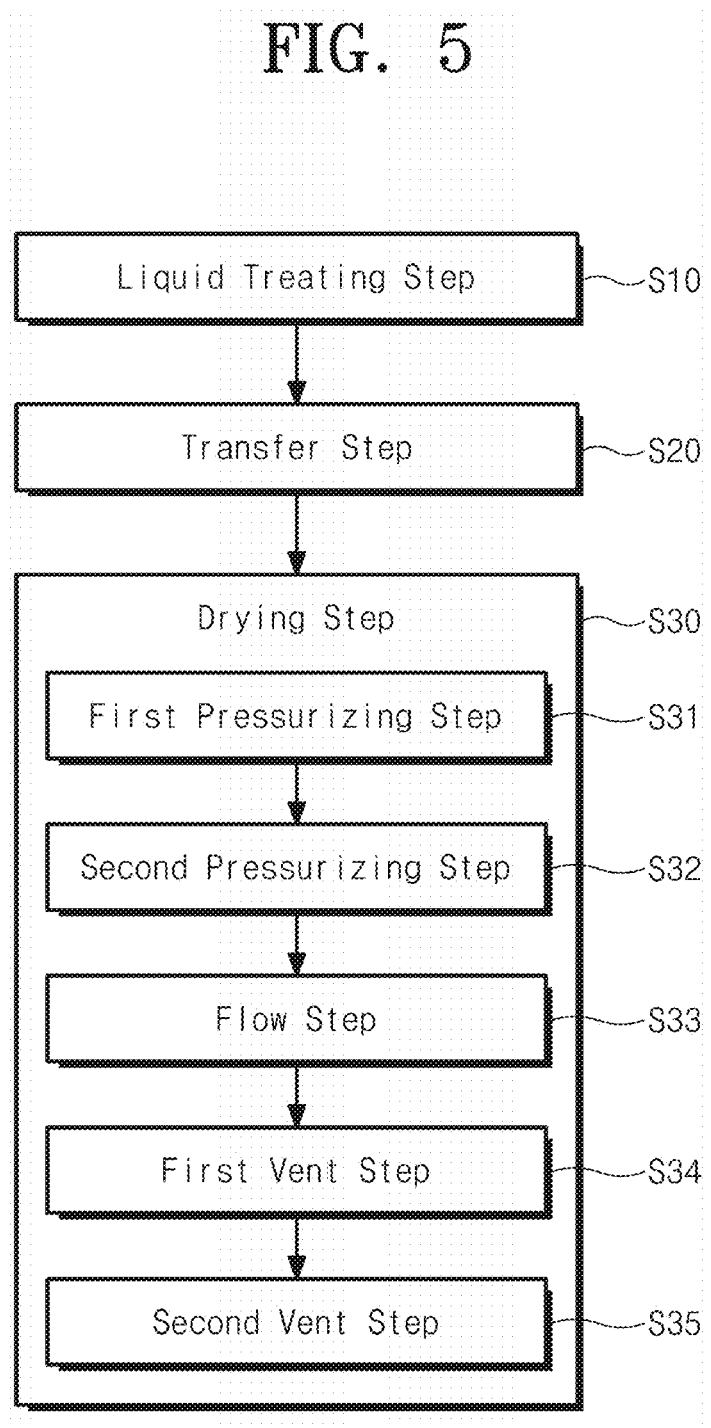
FIG. 5 is a flowchart illustrating a substrate treating method according to an embodiment of the inventive concept.

FIG. 5 is a flowchart illustrating a substrate treating method according to an embodiment of the inventive concept. Referring to FIG. 5, a substrate treating method according to an embodiment of the inventive concept may include a liquid treating step S10, a transfer step S20, and a drying step S30.

Figure 6:
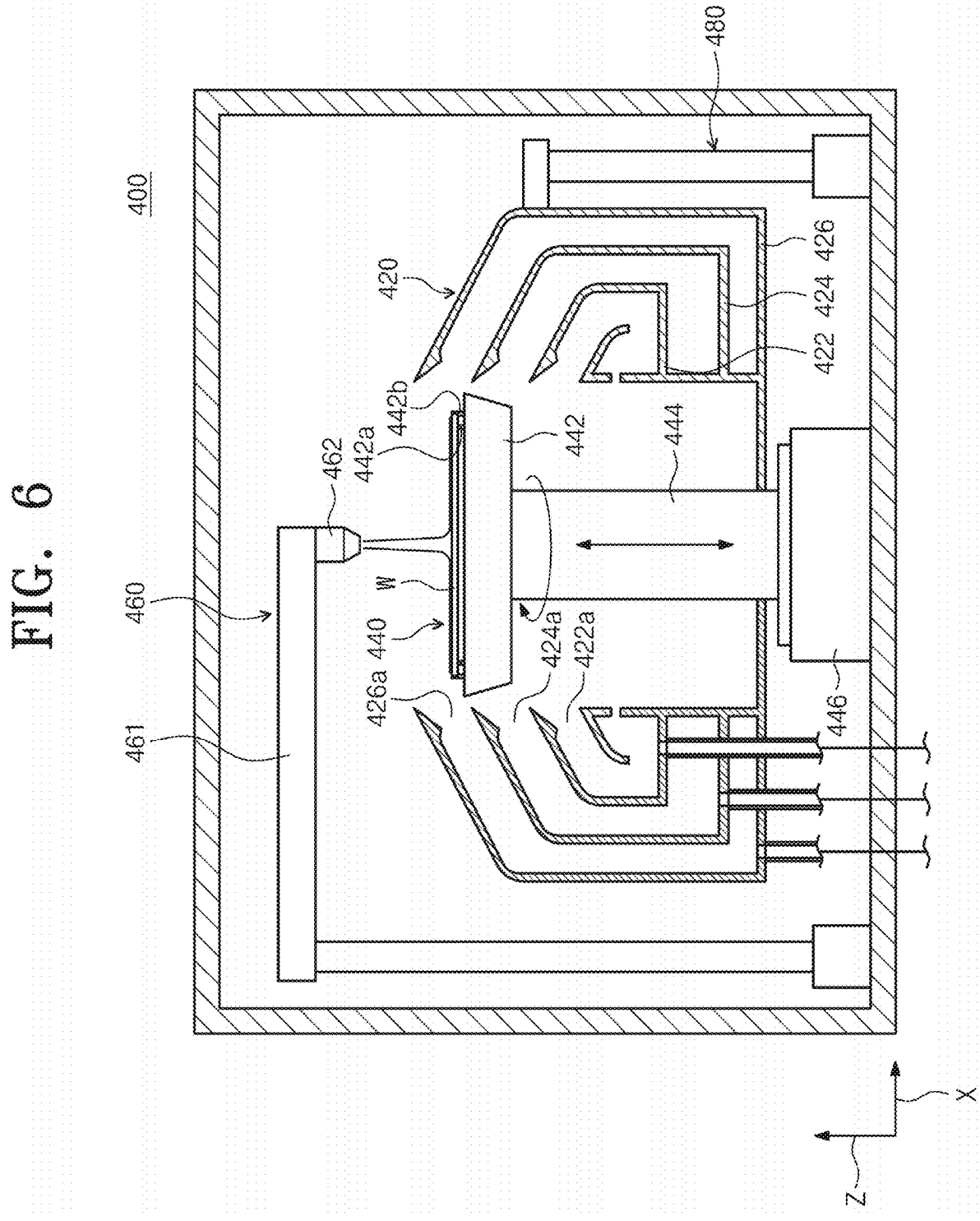
FIG. 6 illustrates the liquid treating chamber performing a liquid treating step of FIG. 5.

The liquid treating step S10 is a step of liquid-treating the substrate W by supplying the treating liquid to the substrate W. The liquid treating step S10 may be performed in the liquid treating chamber 400. For example, in the liquid treating step S10, the substrate W may be liquid-treated by supplying the treating liquid to a rotating substrate W (see FIG. 6). The treating liquid supplied in the liquid treating step S10 may be at least one of the above-described chemical, rinsing liquid, or organic solvent. For example, in the liquid treating step S10, the substrate W may be rinse-treated by supplying a rinsing liquid to the rotating substrate W. Thereafter, an organic solvent may be supplied to the rotating substrate W to replace the rinsing liquid remaining on the substrate W with the organic solvent.

The transfer step S20 is a step of transferring the substrate W. The transfer step S20 may be a step of transferring the substrate W on which the liquid treatment has been performed in the treating chamber 400 to the drying chamber 500. For example, in the transfer step S20, the transfer robot 320 may transfer the substrate W from the liquid treating chamber 400 to the drying chamber 500. A treating liquid may remain on the substrate W in the transfer step S20. For example, the organic solvent may remain on the substrate W. That is, the substrate W may be transferred to the drying chamber 500 wetted with the organic solvent.

The drying step S30 is a step of drying the substrate W. The drying step S30 may be performed in the drying chamber 500. In the drying step S30, the substrate W may be dried by supplying the drying fluid F in the inner space 518 of the body 510 to the substrate W. In the drying step S30, the drying fluid G transferred to the substrate W may be in a supercritical state.

The flow step S33 may be performed after the pressurization steps S31 and S32. The flow step S33 may be a step of generating a flow at the drying fluid G in a supercritical state supplied to the inner space 518 of the body 510.

The vent steps S34 and S35 may be performed after the flow step S33. In the vent steps S34 and S35, the pressure of the inner space 518 of the body 510 may be lowered. For example, in vent steps S34 and S35, the pressure of the inner space 518 of the body 510 may be lowered to an atmospheric pressure.

Hereinafter, the above-described pressurization steps S31 and S32, the flow step S33, and the vent steps S34 and S35 will be described in more detail.

The pressurization steps S31 and S32 may include a first pressurization step S31 and a second pressurization step S32.

Figure 7:
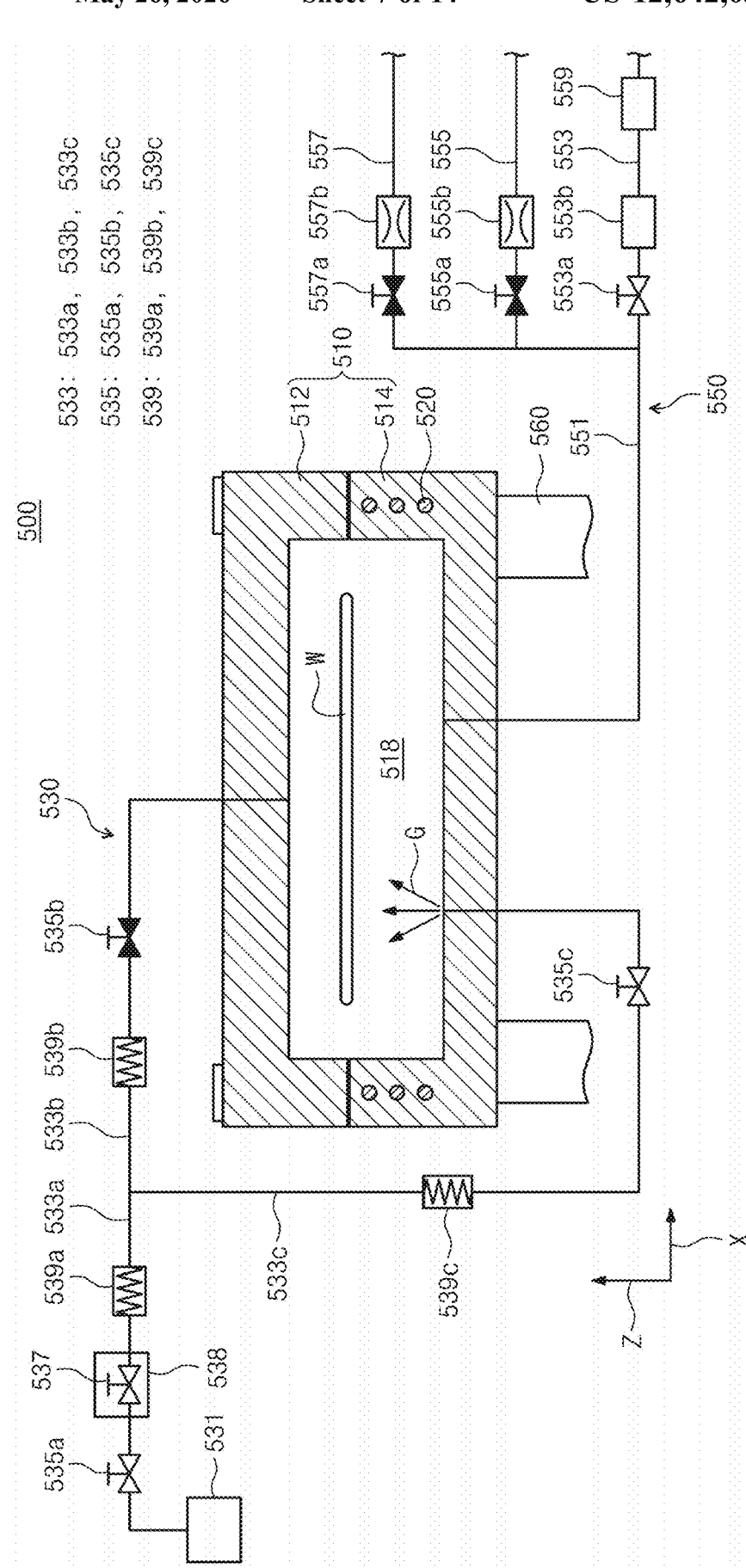
FIG. 7 illustrates the drying chamber performing a first pressurization step of FIG. 5.

In the first pressurization step S31, the second supply line 533*c* may supply the drying fluid G to the inner space 518 of the body 510 (see FIG. 7). That is, in the first pressurization step S31, the drying fluid G may be supplied to a bottom part of the inner space 518 of the body 510, specifically, to beneath the substrate W supported in the inner space 518. In the first pressurization step S31, the pressure of the inner space 518 of the body 510 may be pressurized to a second set pressure P2. The second set pressure P2 may be 120 bar. In addition, the first exhaust valve 553*a* may be maintained in an on state while the first pressurization step S31 is performed. Since the pressure of the inner space 518 of the body 510 does not reach a desired pressure (e.g., a second pressure P2 to be described later) in the first pressurization step S31, even when the first exhaust valve 553a is in an on state, the drying fluid G may not flow in the flow line 553b.

Figure 8:
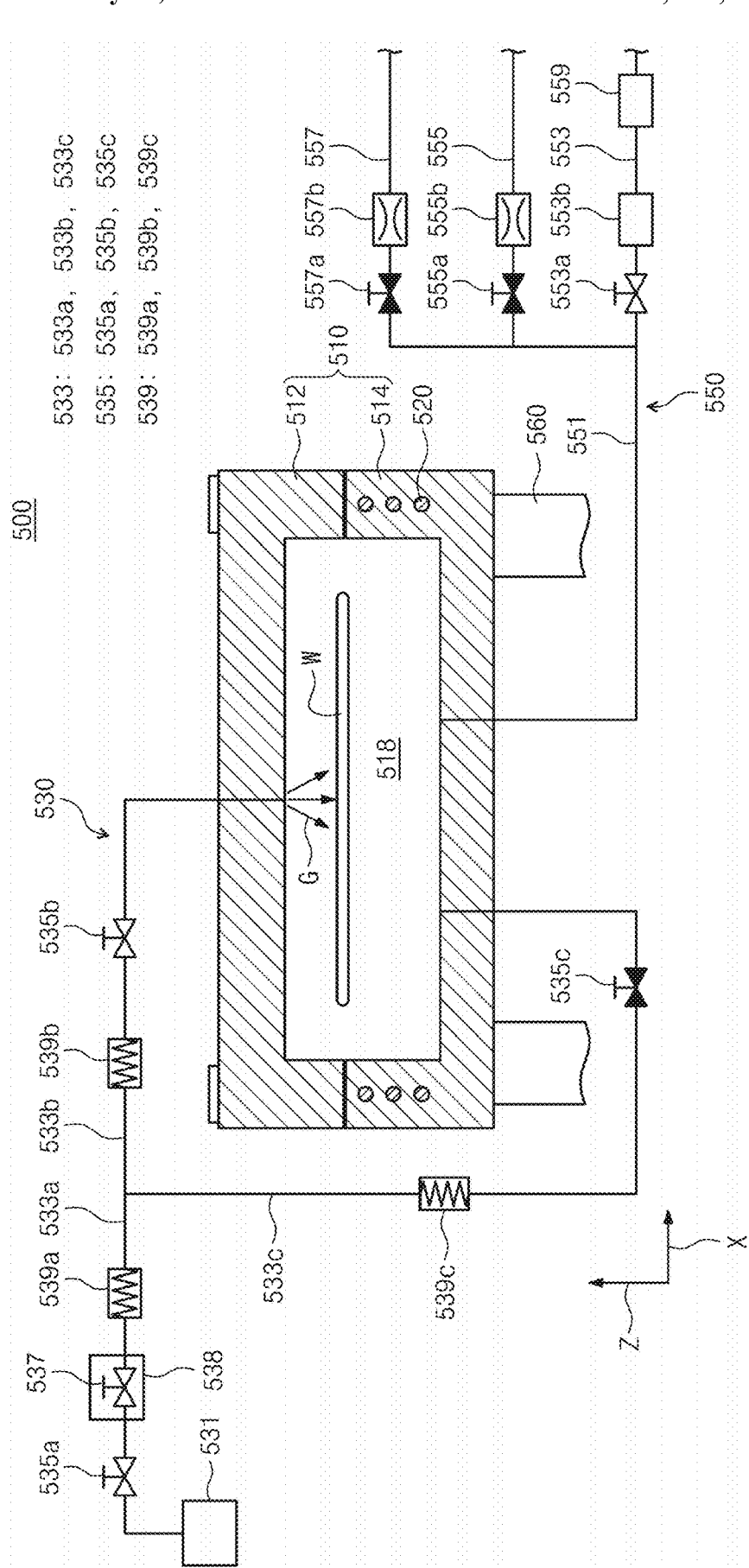
FIG. 8 illustrates the drying chamber performing a second pressurization step of FIG. 5.

In the second pressurization step S32, the first supply line 533a may supply the drying fluid G to the inner space 518 of the body 510 (see FIG. 8). That is, in the second pressurization step S32, the drying fluid G may be supplied to a top part of the inner space 518, specifically, to above the substrate W supported in the inner space 518. In the second pressurization step S32, the pressure of the inner space 518 of the body 510 may be pressurized to the first set pressure P1. The first set pressure P1 may be 150 bar. The first set pressure P1 may be equal to or higher than a critical pressure that allows the drying fluid G to maintain a supercritical state in the inner space 518. In addition, the first exhaust valve 553a may be maintained in an on state while the second pressurization step S32 is performed. Since the pressure of the inner space 518 of the body 510 does not reach a desired pressure (e.g., the second pressure P2) in the second pressurization step S32, even when the first exhaust valve 553a is on, the drying fluid G may not flow in the flow line 553b.

In the aforementioned example, a supply of the drying fluid G by the first supply line 533a to the second pressurization step S32 is described as an example, but this invention is not limited to it. For example, the second pressurization step S32 may be performed by supplying the drying fluid G by the second supply line 533c, or alternatively, by supplying the drying fluid G to both the first supply line 533a and the second supply line 533c.

As the pressurization steps S31 and S32 are performed, the pressure in the inner space 518 may reach a desired pressure. As the pressurization steps S31 and S32 are performed, the inner space 518 may be heated by the temperature adjusting member 520. Accordingly, the drying fluid G supplied to the inner space 518 may be phase-changed to a supercritical state. However, the inventive concept is not limited thereto, and the drying fluid G may be supplied to the inner space 518 in a supercritical state. In this case, since the inner space 518 reaches a desired pressure (e.g., the first set pressure P1) in the pressurization steps S31 and S32, the drying fluid G supplied to the inner space 518 in a supercritical state may be continuously maintained.

Figure 9:
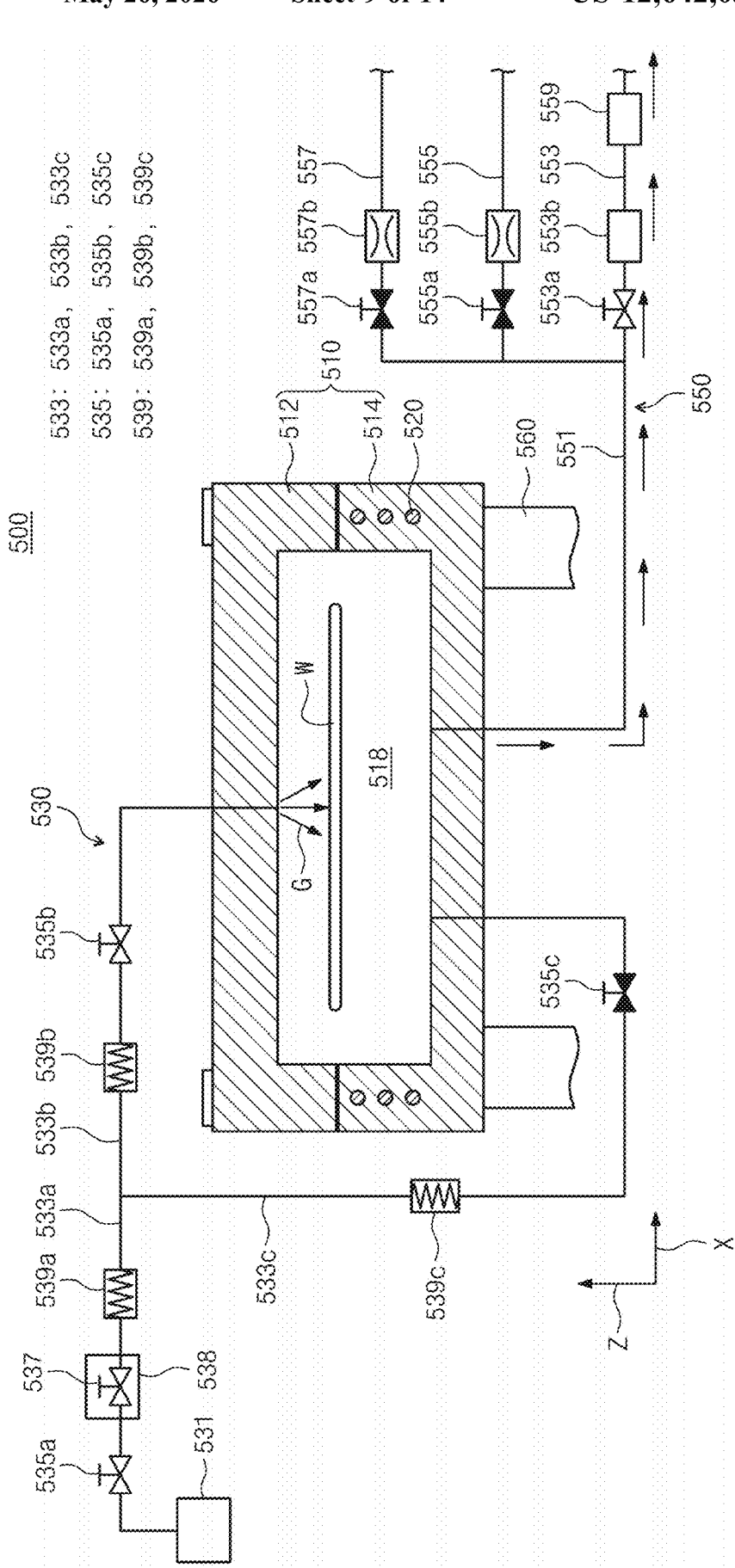
FIG. 9 illustrates the drying chamber performing a flow step of FIG. 5.

In the flow step S33, a flow may be generated with respect to the supercritical drying fluid G supplied to the inner space 318. In the flow step S33, the first supply line 533a may continuously supply the drying fluid G, and at the same time, the flow line 553 may continuously exhaust the drying fluid G (see FIG. 9). That is, a supply of the drying fluid G and an exhaust of the drying fluid G may be performed together. That is, in the flow step S33, while the fluid supply unit 530 supplies the drying fluid G to the inner space 518, the fluid exhaust unit 55 may continue to exhaust the drying fluid G from the inner space 518. In addition, while the flow step S33 is performed, the first exhaust valve 553a installed at a front end of the pressure adjusting member 553b may be maintained in an on state (an open state). In addition, in the flow step S33, the second exhaust valve 555a and the third exhaust valve 557a may be maintained in an off state.

In addition, the pressure adjusting member 553b adjusts the exhaust flow rate per unit time of the drying fluid G flowing in the flow line 553 so that the pressure of the inner space 518 may be constantly maintained at the first set pressure P1 (for example, 150 bar). In addition, a supply rate per unit time of the drying fluid G supplied by the first supply line 533a of the fluid supply unit 530 and an exhaust flow rate exhausted by the fluid exhaust unit 550 through the flow line 553 may remain the same (i.e., a difference between the supply flow rate and the exhaust flow rate is zero or within a threshold). That is, in the flow step S33, the first supply line 533a continuously supplies the drying fluid G, and the flow line 553 continuously exhausts the drying fluid G so that a flow of the drying fluid G may be generated in the inner space 518.

Figure 10:
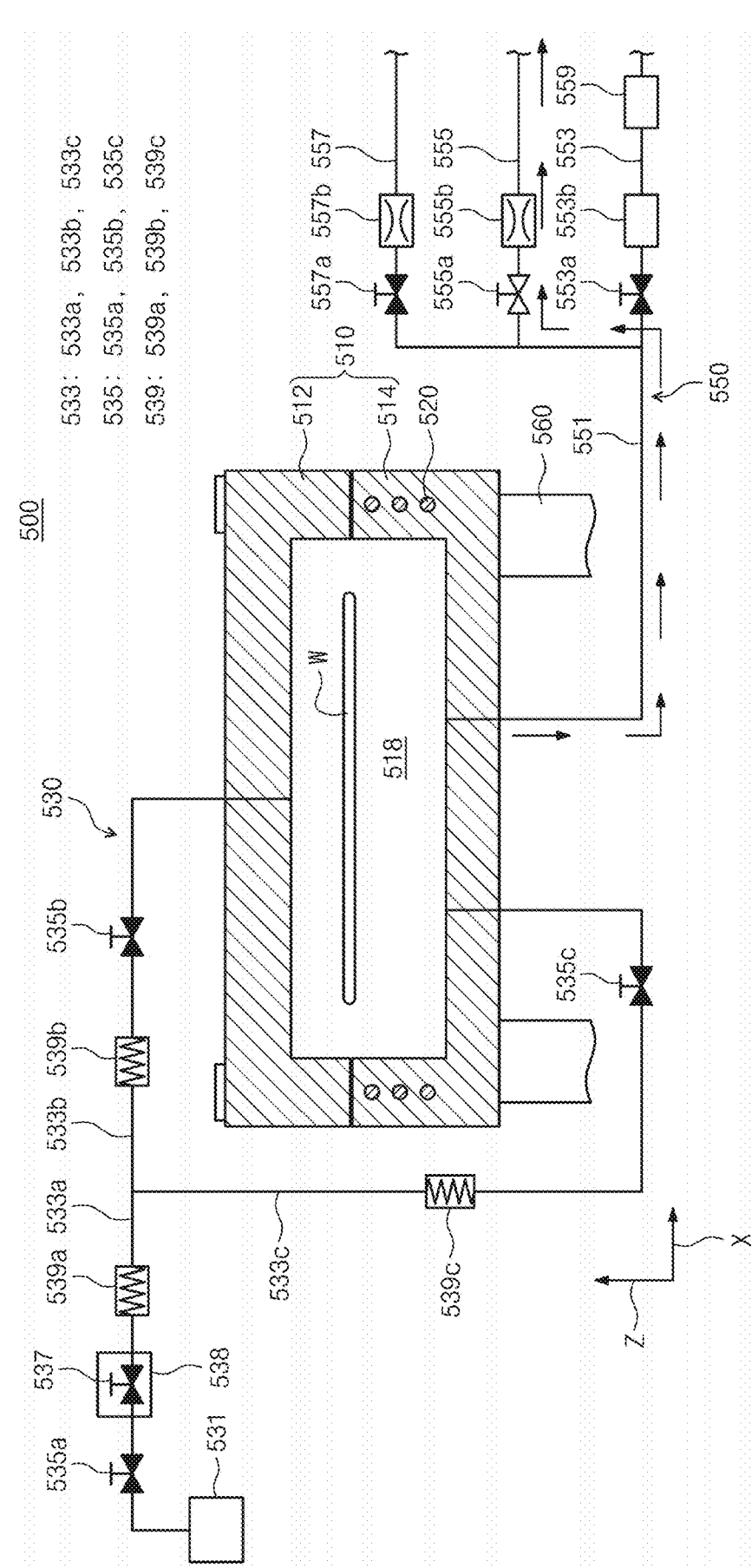
FIG. 10 illustrates the drying chamber performing a first vent step of FIG. 5.

In the first vent step S34, the drying fluid G is exhausted through the slow vent line 555, but the fluid supply unit 530 may stop a supply of the drying fluid G (see FIG. 10). Accordingly, the pressure of the inner space 518 may be lowered. In addition, in the first vent step S34, the second valve 555a may be turned on and in on state may be maintained. In addition, in the first vent step S34, the first exhaust valve 553a and the third exhaust valve 557a may be maintained in an off state.

Figure 11:
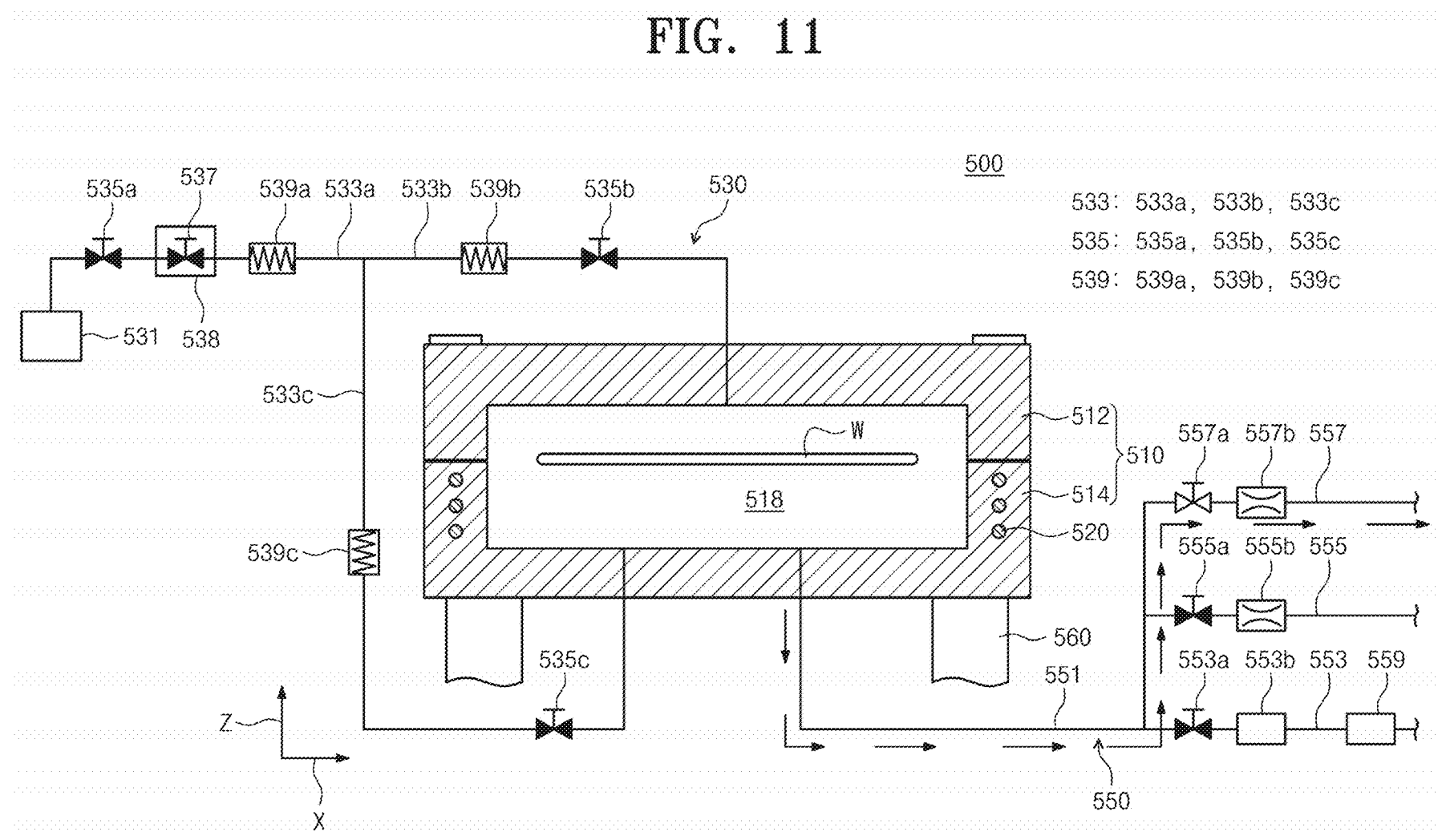

In the second vent step S35, the drying fluid G is exhausted through the quick vent line 557, but the fluid supply unit 530 may stop the supply of the drying fluid G (see FIG. 11). Accordingly, the pressure of the inner space 518 may be lowered. In addition, in the second vent step S35, the third valve 557a may be turned on, and the on state may be maintained. In addition, in the second vent step S35, the first exhaust valve 553a and the second exhaust valve 555a may be maintained in an off state.

In addition, as described above, since the diameter of the flow path of the slow vent line orifice 555b is smaller than the diameter of the flow path of the quick vent line orifice 557b, a depressurization speed in the first vent step S34 may be slower than a depressurization speed in the second vent step S35.

Figure 12:
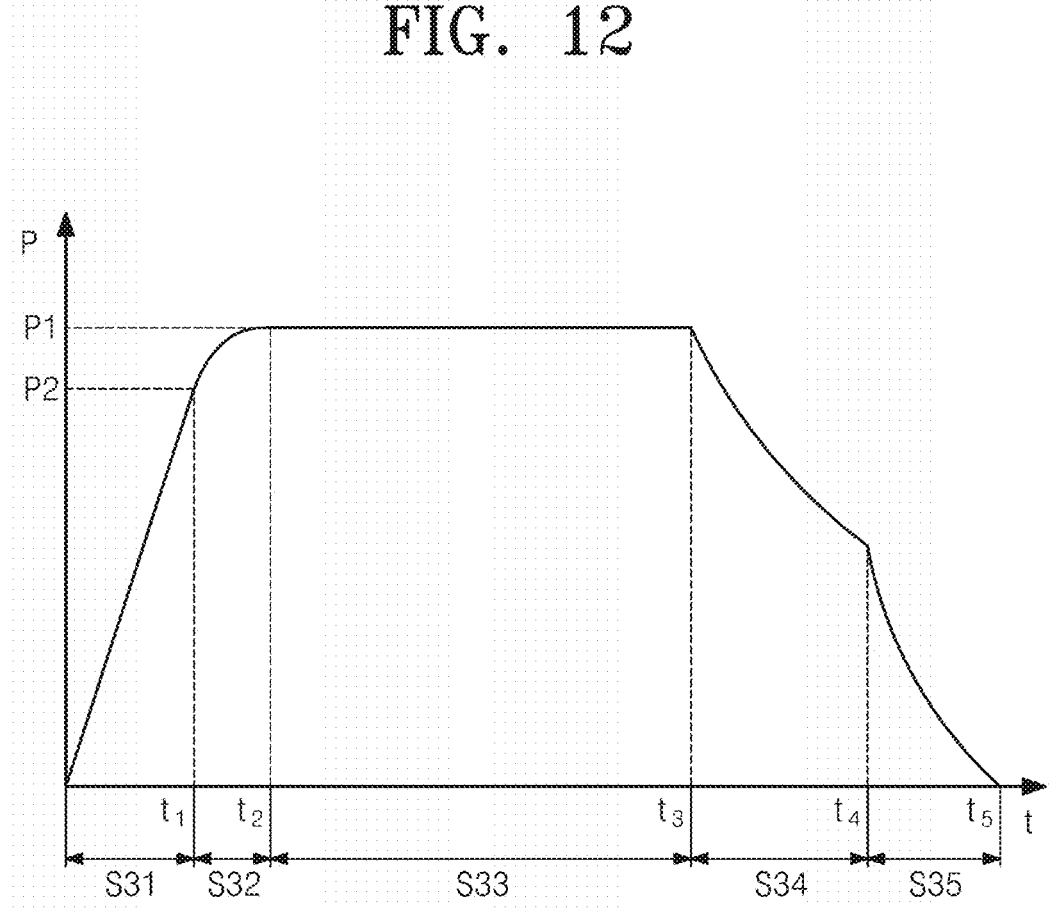
FIG. 12 illustrates a pressure change of an inner space of a body during a drying process of the inventive concept.

FIG. 12 illustrates the pressure change in the inner space of the body during the drying process of the inventive concept. Referring to FIG. 12, in the first pressurization step S31, the pressure of the inner space 518 may be pressurized to the second set pressure P2. The second set pressure P2 may be about 120 bar. In the second pressurization step S32, the pressure of the inner space 518 may be pressurized to the first set pressure P1. The first set pressure P1 may be about 150 bar. In the flow step S33, the pressure of the inner space 518 may be maintained at the first set pressure P1. The depressurization of the inner space 518 can be slowly carried out in the first vent stage S34 and the depressurization of the inner space 518 can be quickly carried out in the second vent stage S35.

Hereinafter, the effects of the inventive concept will be described in detail.

The table below shows a process time and the number of particles remaining on the substrate, when the flow step S33 is performed by the pressure pulsing method described above, and when the flow step S33 is performed by the continuous method of the inventive concept using the flow line 553. In this case, the pressurization steps S31 and S32 and the vent steps S34 and S35 were performed for the same time. In addition, conditions for an amount of an organic solvent remaining on the substrate W were performed in the same manner.

TABLE 1

|  | Time of Flow Step S33 | Cycle | Number of Particles |
|---|---|---|---|
| Pressure Pulsing Method | 65 seconds | 1 | 501 |
|  |  | 2 | 458 |
|  |  | 3 | 436 |

TABLE 1-continued

|  | Time of Flow Step S33 | Cycle | Number of Particles |
|---|---|---|---|
| Continuous Method | 40 seconds | 1 | 167 |
|  |  | 2 | 183 |
|  |  | 3 | 178 |
| Continuous Method | 33 seconds | 1 | 148 |
|  |  | 2 | 143 |
|  |  | 3 | 167 |
| Continuous Method | 25 seconds | 1 | 306 |
|  |  | 2 | 195 |
|  |  | 3 | 188 |
| Continuous Method | 20 seconds | 1 | 227 |
|  |  | 2 | 174 |
|  |  | 3 | 175 |

As may be seen from the above-described table, when the flow step S33 is performed using the continuous method of the inventive concept, a number of particles remaining on the substrate W is the same or lower even when a set time for performing the flow step S33 is reduced compared to a conventional pressure pulsing method. That is, according to an embodiment of the inventive concept, the number of particles remaining on the substrate W may be maintained at the same level as before or lower while reducing a time required to process the substrate W. In addition, as may be seen from the experimental data above, a set time t2 to t3 for which the flow step S33 is performed may be performed for any one time within a range of 20 seconds to 65 seconds, preferably any one time within a range of 25 seconds to 65 seconds. For example, the maintaining step S33 may be performed for 33 seconds or 40 seconds showing a low particle level. In addition, in the maintaining step S33 in this invention, the pressure of the inner space 518 can be maintained at any one pressure belonging to 120 bar to 150 bar. For example, in the maintaining step S33, the pressure of the inner space 518 may be maintained at about 150 bar.

Figure 13:
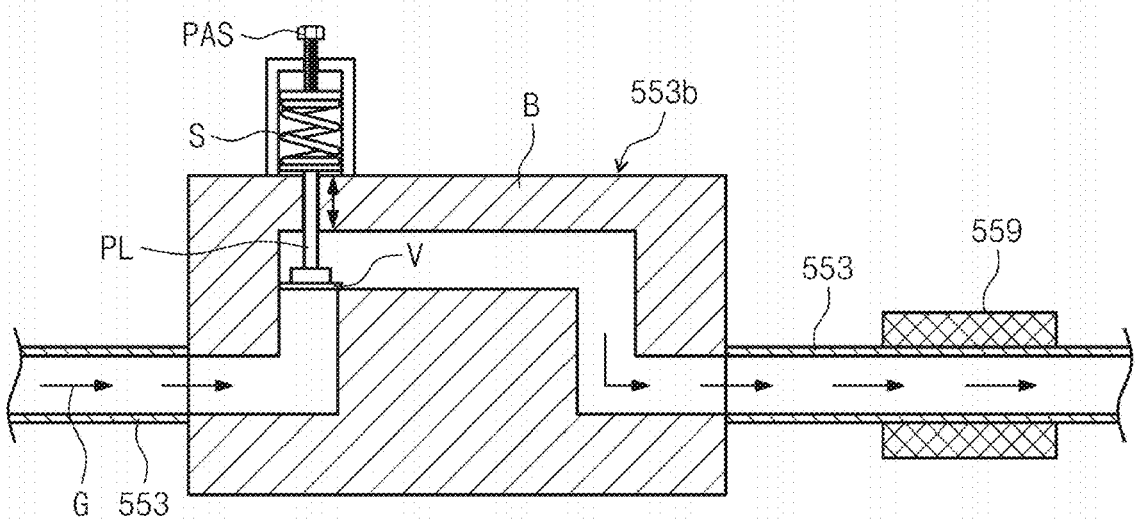
FIG. 13 schematically illustrates a pressure adjusting member and a heating member installed at a flow line of FIG. 4.
Figure 14:
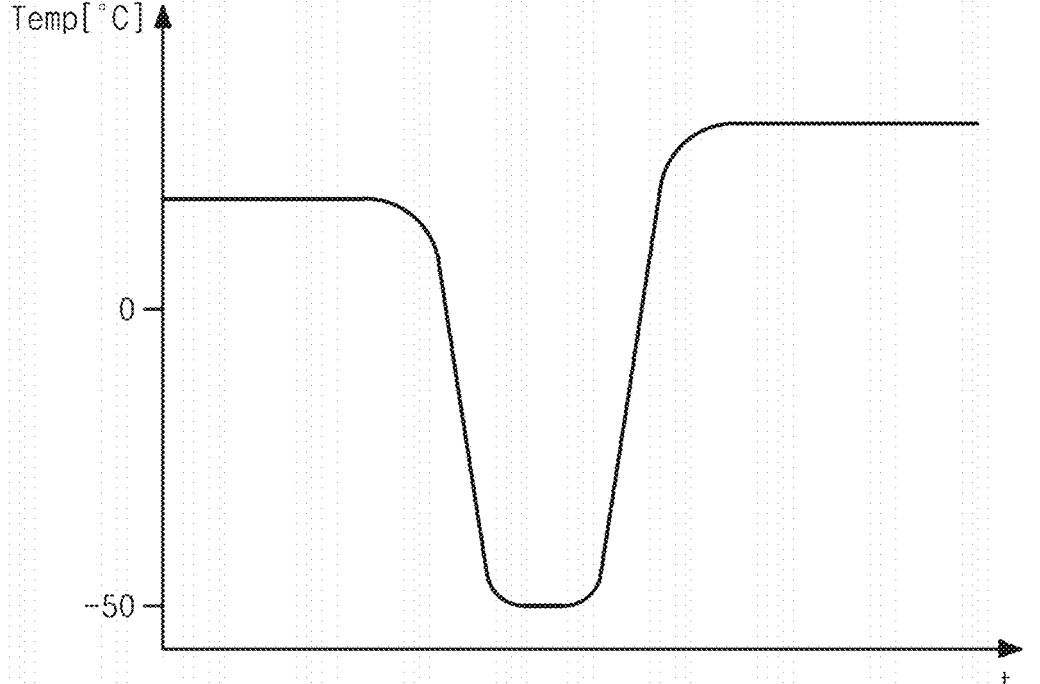
FIG. 14 is a graph illustrating a temperature change of a drying fluid at a back end of the pressure adjusting member when the heating member is not installed at the flow line of FIG. 4.

FIG. 13 schematically illustrates the pressure adjusting member and the heating member installed at the flow line of FIG. 4, and FIG. 14 is a graph illustrating a temperature change of the drying fluid at a further back end of the pressure adjusting member when the heating member is not installed at the flow line of FIG. 4. Referring to FIG. 13 and FIG. 14, the pressure adjusting member 553b used to implement the continuous flow as described above may include a body B having a flow path therein, a flanger PL which adjusts a width of the flow path through which the drying fluid G may flow, a valve V installed at the flanger and a spring, and a pressure adjusting screw. A temperature of the drying fluid G may decrease while passing through the pressure adjusting member 553b. This is because the drying fluid G is heat-insulated and compressed at an end of the valve V, and then may be heat-insulated and expanded while passing through a back end of the valve V and a back end of the body B. In this case, the temperature of the drying fluid G may drop to about −50° C. as shown in FIG. 14. In this case, a condensation/freezing may occur at the back end of the pressure adjusting member 553b. In addition, organic solvents such as an IPA are dissolved in the drying fluid G passing through the inner space 518. When the temperature of the drying fluid G rapidly decreases while passing through the pressure adjusting member 553b, a dissolvability of the drying fluid G becomes very low. In this case, the organic solvents dissolved in the drying fluid G may be extracted and become attached to the flow line 553, and thus, a blockage may occur at the flow line 553. According to an embodiment of the inventive concept, the heating member 559, which is a block heater, is installed at the back end of the pressure adjusting member 553b, thereby compensating for a temperature drop generated by the drying fluid G while passing through the pressure adjusting member 553b. Accordingly, it is possible to solve problems such as the above-described condensation/freezing problem and a blockage at the flow line 553.

Figure 15:
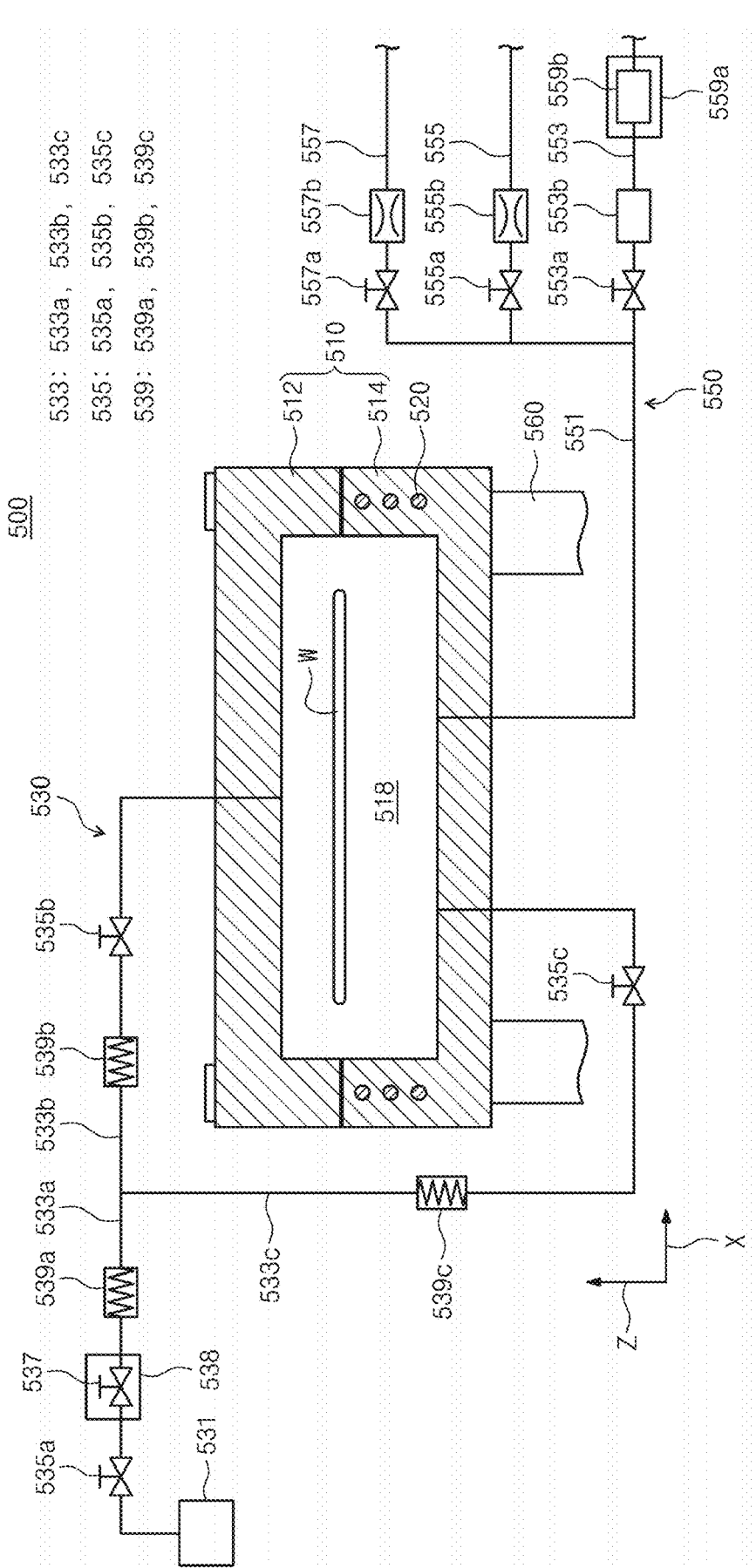
FIG. 15 illustrates the substrate treating apparatus according to another embodiment of the inventive concept.

In the above-described example, the heating member 559 is a block heater installed at a back end of the pressure adjusting member 553b, but the inventive concept is not limited thereto. For example, as shown in FIG. 15, the heating member 559a according to another embodiment may be a pressure adjusting member 553b and, more specifically, a jacket heater installed to surround the pressure adjusting member 553b. In this case, the heating element of the heating member 559a, which is the jacket heater, may be adjusted to a temperature of about 150 to 200° C.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
   a chamber defining an inner space;
   a fluid supply configured to supply a drying fluid to the inner space; and
   a fluid exhaust configured to exhaust the drying fluid from the inner space,
   wherein the fluid exhaust includes,
      an exhaust line connected to the chamber;
      a pressure adjusting member installed at the exhaust line and configured to maintain a pressure of the inner space at a first pressure;
      a heating member installed at the pressure adjusting member or a back end of the pressure adjusting member; and
   a controller configured to control the heating member to adjust a temperature to compensate for a temperature reduction of the drying fluid generated while going through the pressure adjusting member to mitigate one of a condensation and a freezing of the drying fluid while the drying fluid is being supplied to and exhausted from the chamber.

2. The substrate treating apparatus of claim 1, wherein the controller is further configured to
   control the fluid supply to perform a pressurization of the inner space to the first pressure by supplying the drying fluid to the inner space, and
   control the fluid supply and the fluid exhaust to generate a flow of the drying fluid at the inner space by exhausting the drying fluid from the inner space while the drying fluid is supplied to the inner space.

3. The substrate treating apparatus of claim 2, wherein the controller is further configured to control the fluid supply and the fluid exhaust so the drying fluid supplied to the inner space has a difference of 0 between a supply rate per unit time and an exhaust flow rate per unit time of the drying fluid exhausted from the inner space, or a difference within a threshold value.

4. The substrate treating apparatus of claim 3, wherein the controller is further configured to control the fluid supply and the fluid exhaust so the pressure of the inner space is maintained at the first pressure, during the generation of the flow of the drying fluid.

5. The substrate treating apparatus of claim 4, wherein the first pressure is the same as a critical pressure for maintaining a supercritical state of the drying fluid at the inner space, or a pressure higher than the critical pressure.

6. The substrate treating apparatus of claim 2, wherein the fluid exhaust further comprises an exhaust valve installed at a front end of the pressure adjusting member, and wherein the controller configured to controls the fluid exhaust to open the exhaust valve while the drying fluid is being supplied to the inner space of the chamber.

7. The substrate treating apparatus of claim 1, wherein the heating member configured to adjust a temperature to a temperature which can compensate for a temperature reduction of the drying fluid generated while going through the pressure adjusting member.

8. The substrate treating apparatus of claim 1, wherein the heating member includes a heating element configured to generate a heat; and a temperature sensor configured to measure a temperature of the drying fluid flowing through the exhaust line or a temperature of the heating element, and wherein the heating element generates the heat based on a measured result of the temperature sensor.

9. The substrate treating apparatus of claim 8, wherein the heating element turns on to generate the heat when the measured result of the temperature sensor is lower than a bottom limit of a first temperature range, and turns off to stop a generation of the heat when the measured result of the temperature sensor is higher than a top limit of the first temperature range.

10. The substrate treating apparatus of claim 1, wherein the fluid supply comprises:

a fluid supply source for storing and supplying the drying fluid;

a supply line for fluid communicating the fluid supply source and the inner space;

a flow rate adjusting valve installed at the supply line; and a heater installed at the flow rate adjusting valve or at a back end of the flow rate adjusting valve.

11. A substrate treating apparatus for removing a treating liquid remaining on a substrate using a drying fluid in a supercritical state, the substrate treating apparatus comprising:

a chamber providing an inner space;

a fluid supply configured to supply a drying fluid to the inner space;

a fluid exhaust configured to exhaust the drying fluid from the inner space; and a controller configured to control the fluid supply and the fluid exhaust, wherein the controller is configured to control the fluid supply to perform a pressurization step for pressurizing a pressure of the inner space to a first pressure by supplying the drying fluid to the inner space, and wherein the controller is configured to control the fluid supply and the fluid exhaust to perform a flow step of both supplying the drying fluid to the inner space and exhausting the drying fluid from the inner space, while maintaining the pressure of the inner space to the first pressure, wherein the fluid exhaust includes, an exhaust line connected to the chamber;

a pressure adjusting member installed at the exhaust line and configured to maintain the pressure of the inner space to the first pressure; and a heating member installed at the pressure adjusting member or at a back end of the pressure adjusting member, and the controller is further configured to control the heating member to adjust a temperature to compensate for a temperature reduction of the drying fluid generated while going through the pressure adjusting member to mitigate one of a condensation and a freezing of the drying fluid while the drying fluid is being supplied to and exhausted from the chamber.

12. The substrate treating apparatus of claim 11, wherein the fluid exhaust further comprises an exhaust valve installed at a front end of the pressure adjusting member, and wherein the controller controls the fluid exhaust to open the exhaust valve while the flow step is being performed.

13. The substrate treating apparatus of claim 11, wherein the heating member comprises:

a heating element configured to generate a heat; and a temperature sensor configured to measure a temperature of the drying fluid flowing through the exhaust line or a temperature of the heating element, wherein the heating element generates the heat based on a measured result of the temperature sensor.

14. The substrate treating apparatus of claim 13, wherein the heating element turns on to generate the heat when the measured result of the temperature sensor is lower than a bottom limit of a first temperature range, and turns off to stop a generation of the heat when the measured result of the temperature sensor is higher than a top limit of the first temperature range.

15. The substrate treating apparatus of claim 11, wherein the fluid supply comprises:

a fluid supply source for storing and supplying the drying fluid;

a supply line for fluid communicating the fluid supply source and the inner space;

a flow rate adjusting valve installed at the supply line; and a heater installed at the flow rate adjusting valve or at a back end of the flow rate adjusting valve.

16. A substrate treating apparatus comprising:

a chamber providing an inner space;

a transfer robot configured to transfer a substrate having a remaining treating liquid to the inner space;

a fluid supply configured to supply a drying fluid including a carbon dioxide to the inner space;

a fluid exhaust unit configured to exhaust the drying fluid from the inner space, a controller configured to control the fluid supply unit and the fluid exhaust, and the fluid exhaust including an exhaust line connected to the chamber;

a pressure adjusting member installed at the exhaust line and configured to adjust a pressure of the inner space at a first pressure; and a heating member configured to compensate for a temperature reduction of the drying fluid while going through the pressure adjusting member.

17. The substrate treating apparatus of claim 16,
wherein the controller configured to controls the fluid
supply unit to perform a pressurization step for pres-
surizing a pressure of the inner space to the first
pressure by supplying the drying fluid to the inner
space, and
wherein the controller configured to controls the fluid
supply unit and the fluid exhaust unit to perform a flow
step for which the fluid exhaust unit generates a flow of
the drying fluid at the inner space by exhausting the
drying fluid from the inner space while the drying fluid
is supplied to the inner space.

18. The substrate treating apparatus of claim 16, wherein
the heating member is a jacket heater installed to surround
the pressure adjusting member.

19. The substrate treating apparatus of claim 16, wherein
the heating member is a block heater installed at the exhaust
line and installed at a further back end than the pressure
adjusting member.

\* \* \* \* \*